(12) United States Patent
Oh et al.

(10) Patent No.: US 8,790,976 B2
(45) Date of Patent: Jul. 29, 2014

(54) METHOD OF FORMING SEMICONDUCTOR DEVICE HAVING SELF-ALIGNED PLUG

(71) Applicant: Samsung Electronics Co., Ltd., Suwon-si (KR)

(72) Inventors: Gyu-Hwan Oh, Hwaseong-si (KR); Sung-Lae Cho, Gwacheon-si (KR); Byoung-Jae Bae, Hwaseong-si (KR); Ik-Soo Kim, Yongin-si (KR); Dong-Hyun Im, Hwaseong-si (KR); Doo-Hwan Park, Yongin-si (KR); Kyoung-Ha Eom, Incheon (KR); Sung-Un Kwon, Jeonju-si (KR); Chul-Ho Shin, Yongin-si (KR); Sang-Sup Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/942,149

(22) Filed: Jul. 15, 2013

(65) Prior Publication Data

US 2013/0302966 A1   Nov. 14, 2013

Related U.S. Application Data

(62) Division of application No. 13/188,981, filed on Jul. 22, 2011, now Pat. No. 8,507,353.

(30) Foreign Application Priority Data

Aug. 11, 2010  (KR) .................. 10-2010-0077087
Feb. 1, 2011   (KR) .................. 10-2011-0010185

(51) Int. Cl.
    *H01L 21/336*   (2006.01)
(52) U.S. Cl.
    USPC .............. 438/259; 257/E21.35; 257/E21.004; 257/E21.613; 257/E21.645

(58) Field of Classification Search
    CPC .............. H01L 27/1052; H01L 27/10894; H01L 27/105; H01L 45/1233; H01L 27/0629; H01L 27/2436; H01L 27/10814; H01L 27/10852; H01L 27/115; H01L 45/126; H01L 45/06; H01L 27/0207; H01L 45/1683; H01L 27/11502; H01L 27/2463; H01L 45/144; H01L 27/10817; H01L 28/91
    USPC ............. 438/238, 259; 257/E21.35, E21.004, 257/E21.613, E21.645
    See application file for complete search history.

(56) References Cited

U.S. PATENT DOCUMENTS

| 5,656,544 | A  | 8/1997  | Bergendahl et al. |
| 7,220,983 | B2 | 5/2007  | Lung              |
| 7,279,380 | B2 | 10/2007 | Lung              |

(Continued)

FOREIGN PATENT DOCUMENTS

| KR | 1020060001056 A | 1/2006 |
| KR | 1020060002133 A | 1/2006 |

(Continued)

*Primary Examiner* — Michelle Mandala
(74) *Attorney, Agent, or Firm* — Myers Bigel Sibley & Sajovec, PA

(57) ABSTRACT

A conductive pattern on a substrate is formed. An insulating layer having an opening exposing the conductive pattern is formed. A bottom electrode is formed on the conductive pattern and a first sidewall of the opening. A spacer is formed on the bottom electrode and a second sidewall of the opening. The spacer and the bottom electrode are formed to be lower than a top surface of the insulating layer. A data storage plug is formed on the bottom electrode and the spacer. The data storage plug has a first sidewall aligned with a sidewall of the bottom electrode and a second sidewall aligned with a sidewall of the spacer. A bit line is formed on the data storage plug.

9 Claims, 40 Drawing Sheets

(56) References Cited

U.S. PATENT DOCUMENTS

| | | |
|---|---|---|
| 2003/0215978 A1 | 11/2003 | Maimon et al. |
| 2005/0067648 A1 | 3/2005 | Hung et al. |
| 2005/0167741 A1 | 8/2005 | Divakaruni et al. |
| 2007/0069402 A1 | 3/2007 | Johnson |
| 2008/0035961 A1 | 2/2008 | Chen et al. |

FOREIGN PATENT DOCUMENTS

| | | |
|---|---|---|
| KR | 1020060092551 A | 8/2006 |
| KR | 1020090036384 A | 4/2009 |
| KR | 1020100041139 A | 4/2010 |
| KR | 1020100082604 A | 7/2010 |

METHOD OF FORMING SEMICONDUCTOR DEVICE HAVING SELF-ALIGNED PLUG

CROSS-REFERENCE TO RELATED APPLICATION

The present application claims priority as a divisional application of U.S. patent application Ser. No. 13/188,981, filed Jul. 22, 2011 now U.S. Pat. No. 8,507,353, which in turn claims priority under 35 U.S.C. §119 to Korean Patent Application Nos. 10-2010-0077087 filed on Aug. 11, 2010 and 10-2011-0010185 filed on Feb. 1, 2011, the disclosures of which are hereby incorporated by reference in their entirety.

BACKGROUND

1. Field

Embodiments of the inventive concept relate to a method of forming a semiconductor device, and more particularly, to a method of forming a resistive memory device having a data storage plug self-aligned with a bottom electrode and a related device thereof.

2. Description of Related Art

In high-integration density non-volatile memory devices, such as a phase-change random access memory (PRAM), research into improving electrical properties of a unit cell while the size thereof is reduced is underway in various ways.

SUMMARY

Embodiments of the inventive concept provide a method of forming a semiconductor device capable of preventing or reducing defects in alignment between a bottom electrode and a data storage plug and adjusting the size of the bottom electrode and the data storage plug.

The technical objectives of the inventive concept are not limited to the above disclosure; other objectives may become apparent to those of ordinary skill in the art based on the following description.

In accordance with an aspect of the inventive concept, a method of fabricating a semiconductor device is provided. The method includes forming a conductive pattern on a substrate. An insulating layer having an opening exposing the conductive pattern is formed. A bottom electrode is formed on the conductive pattern and a first sidewall of the opening. A spacer is formed on the bottom electrode and a second sidewall of the opening. The spacer and the bottom electrode are formed to be lower than a top surface of the insulating layer. A data storage plug is formed on the bottom electrode and the spacer. The data storage plug has a first sidewall aligned with a sidewall of the bottom electrode and a second sidewall aligned with a sidewall of the spacer. A bit line is formed on the data storage plug.

The bottom electrode may include an upper part and a lower part so as to have an L-shaped cross section. The upper part may have a vertical length longer than a horizontal length and the lower part may have a horizontal length longer than a vertical length. The spacer may be formed on a sidewall of the upper part of the bottom electrode and the lower part of the bottom electrode.

The bottom electrode may entirely cover a top surface of the conductive pattern. The spacer may be formed of a material layer having an etch selectivity with respect to the insulating layer, and the spacer may have a higher electrical resistance than the bottom electrode.

The bottom electrode and the spacer may constitute a bottom electrode structure, and a distance between the first sidewall and the second sidewall may be the same as a top surface of the bottom electrode structure.

The data storage plug may have a top surface having the same height as that of the insulating layer.

The data storage plug may be formed of a material selected from the group consisting of a phase-change plug, a polymer plug, a nanoparticle plug, and a resistance-change plug.

Forming the bottom electrode and the spacer may include forming the spacer on the sidewall of the opening. A bottom electrode layer may be formed on the substrate having the spacer. The bottom electrode layer may be in contact with the sidewall of the spacer. The bottom electrode layer may be anisotropically etched, so that the bottom electrode may be formed. The method may include etching the spacer and the bottom electrode.

Forming the bottom electrode and the spacer may include forming a bottom electrode layer covering the sidewall and a bottom of the opening and the insulating layer. It may include forming a spacer layer covering the bottom electrode layer. Also, it may include etching the spacer layer to expose the bottom electrode layer on an upper part of the insulating layer and the bottom of the opening. Further, it may include removing the exposed bottom electrode layer.

In accordance with another aspect of the inventive concept, a method of fabricating a semiconductor device is provided. The method includes forming a conductive pattern on a substrate. A first insulating pattern having a first trench is formed on the conductive pattern. A first spacer is formed on a sidewall of the first trench. A second trench exposing the conductive pattern is formed below the first trench using the first spacer as an etch mask. A bottom electrode is formed on sidewalls of the first spacer and the second trench. A second insulating pattern filling the first trench and the second trench is formed. An opening is formed between the first insulating pattern and the second insulating pattern by recessing the first spacer and recessing the bottom electrode. A data storage plug filling the opening is formed.

In other embodiments, forming the first insulating pattern may include forming a first molding layer on the substrate having the conductive pattern. A second molding layer may be formed on the first molding layer. The second molding layer may be patterned to form the first trench.

In still other embodiments, the first molding layer and the second molding layer may be formed of different material layers. The first molding layer may be exposed on a bottom of the first trench.

In yet other embodiments, a bottom of the first spacer may be in contact with the first molding layer.

In yet other embodiments, the data storage plug may be in contact with the recessed bottom electrode and the first molding layer.

In yet other embodiments, the first spacer may be formed of a material layer having an etch selectivity with respect to the first insulating pattern and the second insulating pattern.

In yet other embodiments, a second spacer may be formed between the bottom electrode and the second insulating pattern. Forming the bottom electrode and the second spacer may include forming a bottom electrode layer covering the first insulating pattern, the first spacer, and an inner wall of the second trench. A second spacer layer may be formed on the bottom electrode layer. The second spacer layer may be anisotropically etched to partially expose the bottom electrode layer. The exposed bottom electrode layer may be removed.

In yet other embodiments, the bottom electrode may be in contact with a sidewall and bottom of the second spacer.

In yet other embodiments, the second spacer may be formed of a material layer having an etch selectivity with respect to the first spacer.

Detailed particulars of other embodiments may be included in the detailed description of the invention and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
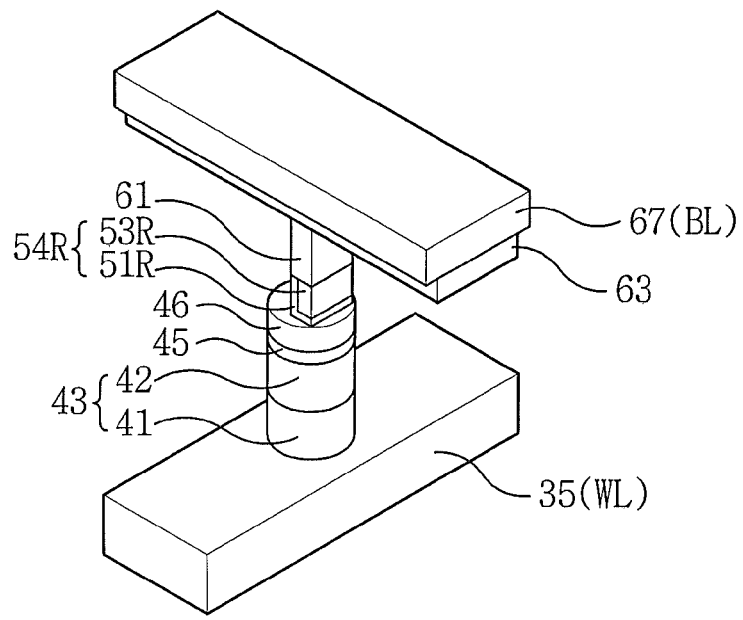
FIG. 1 is perspective view illustrating a main constitution of a semiconductor device according to a first embodiment of the inventive concept.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

FIRST EMBODIMENT

Figure 2:
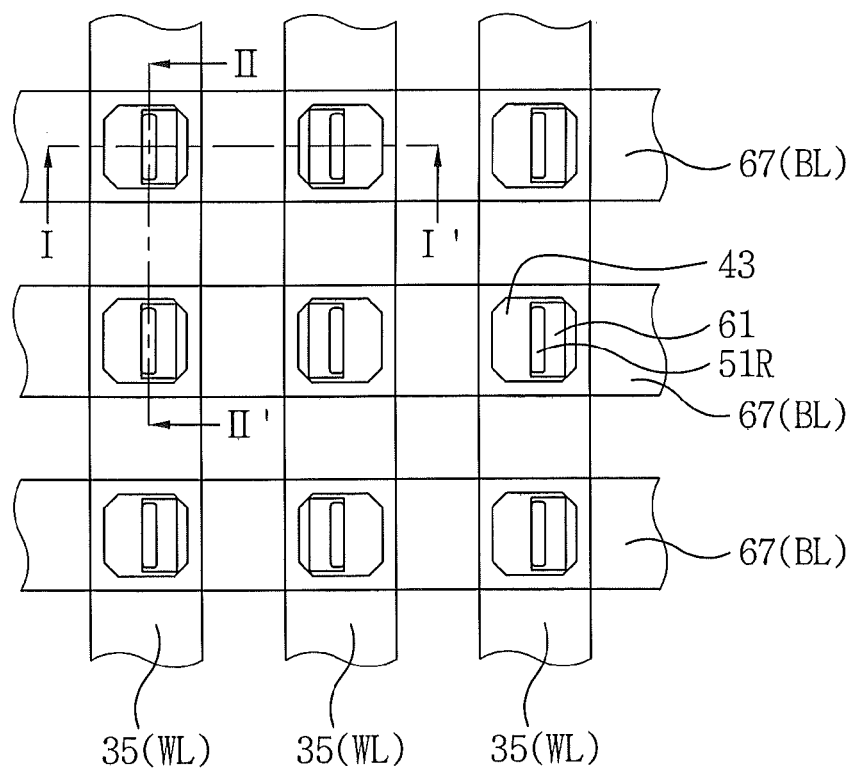
FIG. 2 is a layout of a semiconductor device according to a first embodiment of the inventive concept.
Figure 3:
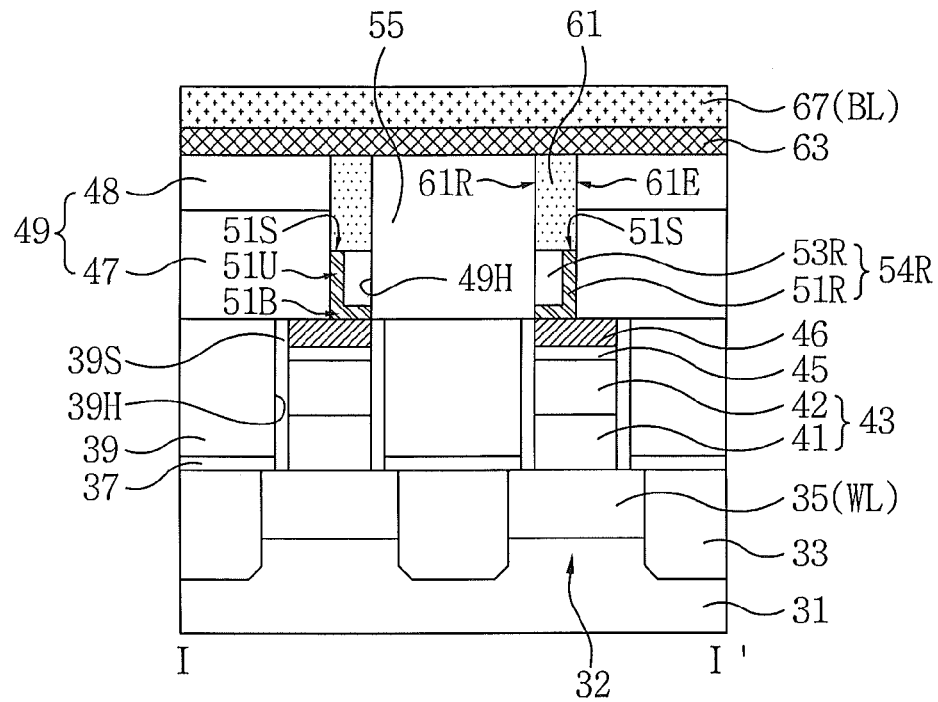
FIG. 3 is a cross-sectional view taken along line I-I' of FIG. 2.
Figure 4:
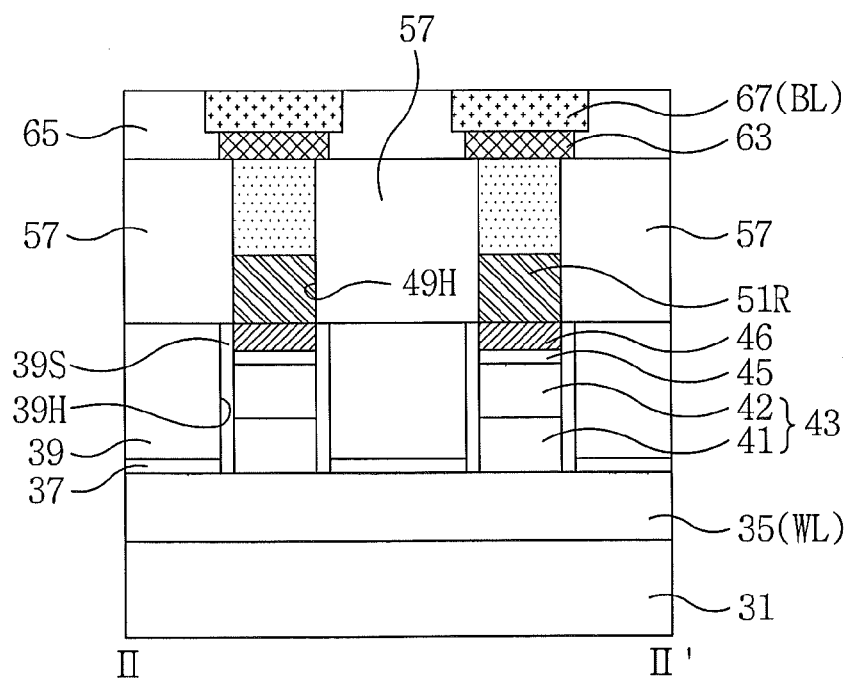
FIG. 4 is a cross-sectional view taken along line II-II' of FIG. 2.

FIG. 1 is perspective view illustrating a main constitution of a semiconductor device according to a first embodiment of the inventive concept. A semiconductor device according to a first embodiment may be a resistive memory, e.g., a phase-change random access memory (PRAM). FIG. 2 is a layout for describing a semiconductor device according to a first embodiment of the inventive concept, FIG. 3 is a cross-sectional view taken along line I-I' of FIG. 2, and FIG. 4 is a cross-sectional view taken along line II-II' of FIG. 2.

Referring to FIG. 1, the semiconductor device may include a word line (WL) 35, a diode 43, a metal silicide pattern 45, a diode electrode 46, a bottom electrode structure 54R, a data storage plug 61, an upper electrode 63, and a bit line (BL) 67, which are serially connected to each other. The diode 43 may include a first semiconductor pattern 41 and a second semiconductor pattern 42, which are sequentially stacked. The bottom electrode structure 54R may include a bottom electrode 51R and a spacer 53R. The data storage plug 61 may be self-aligned with the bottom electrode structure 54R.

The data storage plug 61 may be formed of a material selected from the group consisting of a phase-change plug, a polymer plug, a nanoparticle plug and a resistance-change plug. For example, the resistance-change plug may include a $SrTiO_3$ layer. Also, when the data storage plug 61 is formed of a phase-change plug, the phase-change plug may be a material layer formed of a material selected from the group consisting of a QeSbTe layer, a GeTeAs layer, a SnTeSn layer, a GeTe layer, an SbTe layer, a SeTeSn layer, a GeTeSe layer, an SbSeBi layer, a GeBiTe layer, a GeTeTi layer, an InSe layer, a GaTeSe layer, and an InSbTe layer. Moreover, the phase-change plug may be formed of a material selected from the group consisting of a GeSbTe layer, a GeTeAs layer, a SnTeSn layer, a GeTe layer, an SbTe layer, a SeTeSn layer, a GeTeSe layer, an SbSeBi layer, a GeBiTe layer, a GeTeTi layer, an InSe layer, a GaTeSe layer, and an InSbTe layer and a material selected from the group consisting of C, N, Si, O, and N.

The diode 43 may function as a switching device. In another embodiment, the switching device may be a transistor.

Referring to FIG. 2, WLs 35 arranged two-dimensionally in parallel to each other in the cell array region of the semiconductor device may be provided. BLs 67 crossing the WLs 35 may be arranged. The BLs 67 may be arranged two-dimensionally in parallel to each other. Diodes 43, bottom electrodes 51R and data storage plugs 61 may be disposed at intersections of the WLs 35 and the BLs 67.

Referring to FIGS. 3 and 4, an isolation layer 33 defining an active region 32 may be provided in a predetermined region of a semiconductor substrate 31. The WLs 35 may be disposed in the active region 32. An etch stop layer 37 and a lower insulating layer 39, which are sequentially stacked on the WLs 35 and the isolation layer 33, may be provided. A diode hole 39H penetrating the lower insulating layer 39 and the etch stop layer 37 and exposing the WLs 35 may be disposed. A contact spacer 39S may be disposed on sidewalls of the diode hole 39H. A first semiconductor pattern 41, a second semiconductor pattern 42, a metal silicide pattern 45, and a diode electrode 46 may be disposed in the diode hole 39H. The first semiconductor pattern 41 and the second semiconductor pattern 42 may constitute a diode 43. Top surfaces of the diode electrode 46 and the lower insulating layer 39 may be disposed at the same level. The plurality of diode holes 39H may be arranged on the WLs 35 at predetermined intervals. In some embodiments, the diode electrode 46 may be referred to as a conductive pattern or a landing pad.

A first insulating pattern 49, a second insulating pattern 55, a third insulating pattern 57, a bottom electrode structure 54R, and a data storage plug 61 may be provided on the lower insulating layer 39 and the diode electrode 46. The first insulating pattern 49 may include a first nitride layer 47 and a first oxide layer 48 that are sequentially stacked. The first insulating pattern 49, the second insulating pattern 55, and the third insulating pattern 57 may constitute an insulating layer 49, 55 and 57. A contact hole 49H exposing the diode electrode 46 may be disposed in the insulating layer 49, 55 and 57. The bottom electrode structure 54R may be disposed in the contact hole 49H. A top surface of the bottom electrode structure 54R may be disposed at a lower level than that of the insulating layer 49, 55 and 57. The data storage plug 61 may be disposed on the bottom electrode structure 54R. A top surface of the data storage plug 61 may have the same height as that of the insulating layer 49, 55 and 57.

The bottom electrode structure 54R may include a bottom electrode 51R and a spacer 53R facing each other. The bottom electrode 51R may be in contact with a sidewall of the contact hole 49H and the diode 46. The bottom electrode 51R may include an upper part 51U and a lower part 51B so as to have an L-shaped cross section. The vertical length of the upper part 51U may be longer than the horizontal length. The horizontal length of the lower part 51B may be longer than the vertical length. The spacer 53R may be disposed on a sidewall of the upper part 51U and the lower part 51B. The spacer 53R may be formed of a material layer exhibiting a higher electrical resistance than the bottom electrode 51R and an etch selectivity with respect to the insulating layers 49, 55 and 57.

The data storage plug 61 may include a first sidewall 61E arranged on a sidewall of the bottom electrode 51R and a second sidewall 61R arranged on a sidewall of the spacer 53R. A distance between the first sidewall 61E and the second sidewall 61R may be the same as a top surface of the bottom electrode structure 54R. The data storage plug 61 may be self-aligned with the bottom electrode structure 54R.

An upper insulating layer 65, an upper electrode 63, and a BL 67 may be disposed on the insulating layers 49, 55 and 57.

SECOND EMBODIMENT

A method of forming a semiconductor device according to a second embodiment of the inventive concept will be described with reference to FIGS. 5 to 16. The second embodiment may include a similar constitution to those illustrated in FIGS. 2 to 4.

Figure 5:
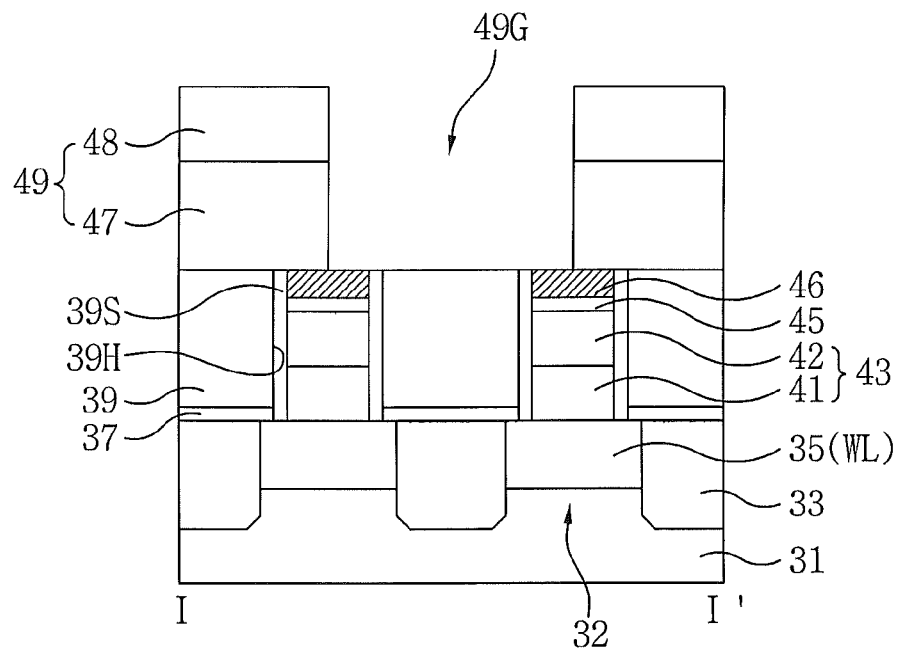
FIGS. 5 to 9, 13, 14, and 16 are cross-sectional views taken along line I-I' of FIG. 2 illustrating a method of forming a semiconductor device according to a second embodiment of the inventive concept.

Referring to FIGS. 2 and 5, an isolation layer 33 defining active regions 32 may be formed in a predetermined region of a semiconductor substrate 31. WLs 35 may be formed in the active regions 32. An etch stop layer 37 and a lower insulating layer 39 may be sequentially formed on the WLs 35. Diode holes 39H penetrating the lower insulating layer 39 and the etch stop layer 37 and exposing the WLs 35 may be formed. Contact spacers 39S may be formed on sidewalls of the diode holes 39H. A first semiconductor pattern 41 and a second semiconductor pattern 42 may be sequentially formed in the diode holes 39H. The first semiconductor pattern 41 and the second semiconductor pattern 42 may constitute a diode 43. A metal silicide pattern 45 and a diode electrode 46 may be sequentially stacked on the diode 43. Then, a first insulating pattern 49 having a groove 49G may be formed on the semiconductor substrate 31.

The semiconductor substrate 31 may be a silicon wafer or a silicon on insulator (SOI) wafer. The following description will be based on the assumption that the semiconductor substrate 31 is formed of a silicon wafer containing P-type impurity ions. The isolation layer 33 may be formed using a shallow trench isolation (STI) technique. The isolation layer 33 may be formed of a silicon oxide layer, a silicon nitride layer, and/or a silicon oxynitride layer. The WLs 35 may be formed by implanting N-type impurity ions into the active regions 32.

In some embodiments, while the WLs 35 may be formed of a conductive pattern formed on the semiconductor substrate 31, the description thereof will be omitted for clarity.

The etch stop layer 37 may cover the WLs 35 and the isolation layer 33. The lower insulating layer 39 may cover the etch stop layer 37. The lower insulating layer 39 may be formed of a silicon oxide layer, a silicon nitride layer, and/or a silicon oxynitride layer. The etch stop layer 37 may be formed of a material layer having an etch selectivity with respect to the lower insulating layer 39. For example, when the lower insulating layer 39 is formed of a silicon oxide layer, the etch stop layer 37 may be formed of a silicon nitride layer. The lower insulating layer 39 and the etch stop layer 37 may be patterned to form the diode holes 39H. The diode holes 39H may be formed to have various shapes, such as a circle or quadrangle or a quadrangle having rounded corners. The contact spacers 39S may be formed of a silicon oxide layer, a silicon nitride layer or a silicon oxynitride layer.

The first semiconductor pattern 41 may be formed between the second semiconductor pattern 42 and the WLs 35. The first semiconductor pattern 41 may be formed of a silicon layer containing N-type impurity ions. The second semiconductor pattern 42 may be formed of a silicon layer containing P-type impurity ions. In some embodiments, the order of stacking the first semiconductor pattern 41 and the second semiconductor pattern 42 may be changed. The metal silicide pattern 45 may be formed of a CoSi layer, a NiSi layer, a WSi layer, a TiSi layer, and/or a TaSi layer. For example, the metal silicide pattern 45 may be formed of a CoSi layer. The diode electrode 46 may include a conductive pattern formed of a material selected from the group consisting of a W layer, a WN layer, a WSi layer, a Ti layer, a TiN layer, a TiAlN layer, a TiCN layer, a TiSiN layer, a TiON layer, a Ta layer, a TaN layer, a TaAlN layer, a TaCN layer, a TaSiN layer, a C layer, a CN layer, a CoSi layer and combinations thereof. For example, the diode electrode 46 may be formed of a W layer. Top surfaces of the lower insulating layer 39 and the diode electrode 46 may be exposed on substantially the same plane. As a result, the diode holes 39H may be filled with the diode 43, the metal silicide pattern 45 and the diode electrode 46, respectively. Further, the plurality of diode electrodes 46 two-dimensionally arranged in column and row directions may be provided on the semiconductor substrate 31.

In other embodiments, the diode electrode 46 may be referred to as a landing pad.

The first insulating pattern 49 may be formed of a silicon oxide layer, a silicon nitride layer, and/or a silicon oxynitride layer. The second embodiment of the inventive concept will be described under the assumption that the first insulating pattern 49 is formed by sequentially stacking a first nitride layer 47 and a first oxide layer 48. The first nitride layer 47 may be formed of a silicon nitride layer, and the first oxide layer 48 may be formed of a silicon, oxide layer. The first nitride layer 47 may be formed thicker than the first oxide layer 48. The first insulating pattern 49 may be formed by forming the first nitride layer 47 and the first oxide layer 48 that cover the entire surface of the semiconductor substrate 31, and consecutively patterning the first oxide layer 48 and the first nitride layer 47. The first oxide layer 48 may function as a hard mask pattern.

The groove 49G may be formed to expose between the WLs 35. A top surface of the diode electrode 46 may be partially exposed on a bottom of the groove 49G. That is, the first insulating pattern 49 may partially cover the top surface of the diode electrode 46. In this case, sidewalls of the first insulating pattern 49 may be formed to cross the top surface of the diode electrode 46.

Figure 6:
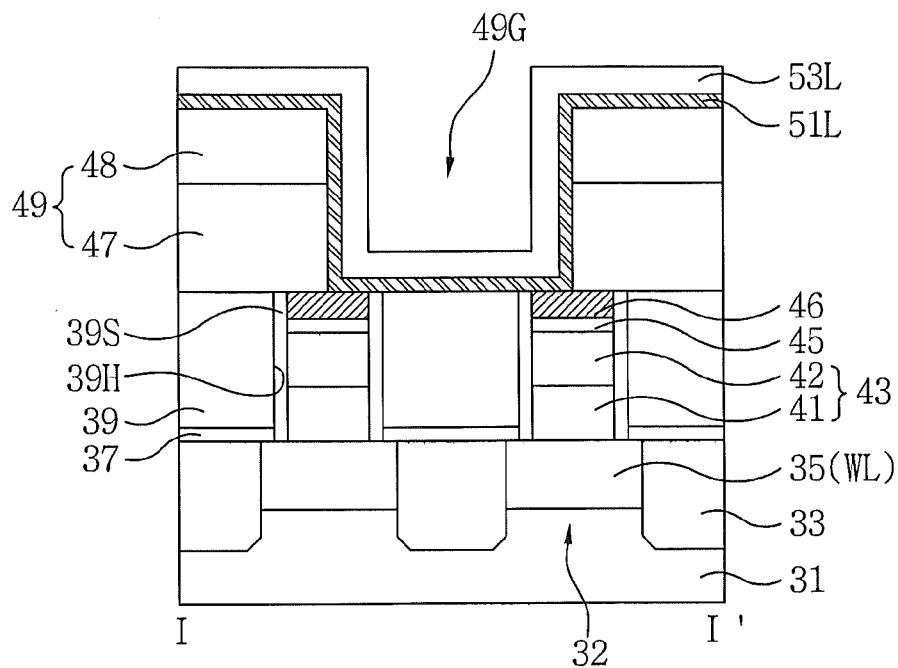

Referring to FIGS. 2 and 6, a bottom electrode layer 51L conformally covering a surface of the first insulating pattern 49 may be formed. A spacer layer 53L conformally covering a surface of the bottom electrode layer 51L may be formed. The bottom electrode layer 51L and the spacer layer 53L may cover a sidewall of the groove 49G. The bottom electrode layer 51L may be formed of a material selected from the group consisting of a TiN layer, a TiAlN layer, a TiCN layer, a TiSiN layer, a TiON layer, TaN layer, a TaAlN layer, a TaCN layer, a TaSiN layer, a C layer, a CN layer, a CoSi layer, a WN layer, a WSi layer and combinations thereof. The spacer layer 53L may be formed of a material layer exhibiting an etch selectivity with respect to the first insulating pattern 49 and a higher electrical resistance than the bottom electrode layer 51L. The spacer layer 53L may be formed of a material selected from the group consisting of a Si layer, a SiO layer, a SiN layer, a SiON layer, a C layer, a SiC layer, a CN layer, a HfO layer, and a Tip layer. For example, the spacer layer 53L may be formed of a polysilicon layer.

Figure 7:
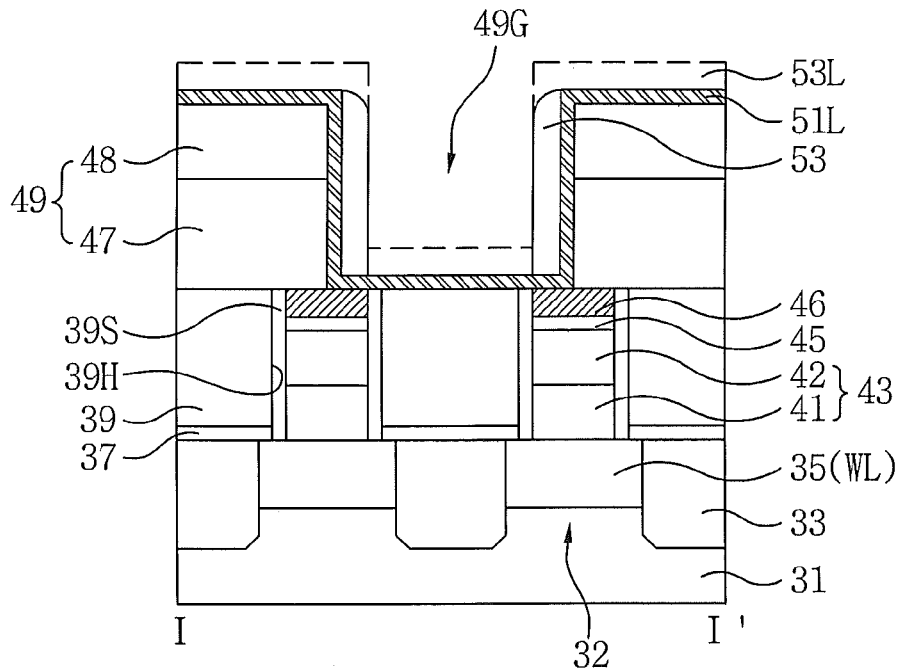

Referring to FIGS. 2 and 7, the spacer layer 53L may be partially removed to form a preliminary spacer 53 covering a sidewall of the first insulating pattern 49. The spacer layer 53L may be partially removed using an anisotropic etching process. In this case, the preliminary spacer 53 may be referred to as a resistive spacer. As a result, the bottom electrode layer 51L may be exposed on the first insulating pattern 49. Moreover, the bottom electrode layer 51L may be exposed on a bottom of the groove 49G as well.

Figure 8:
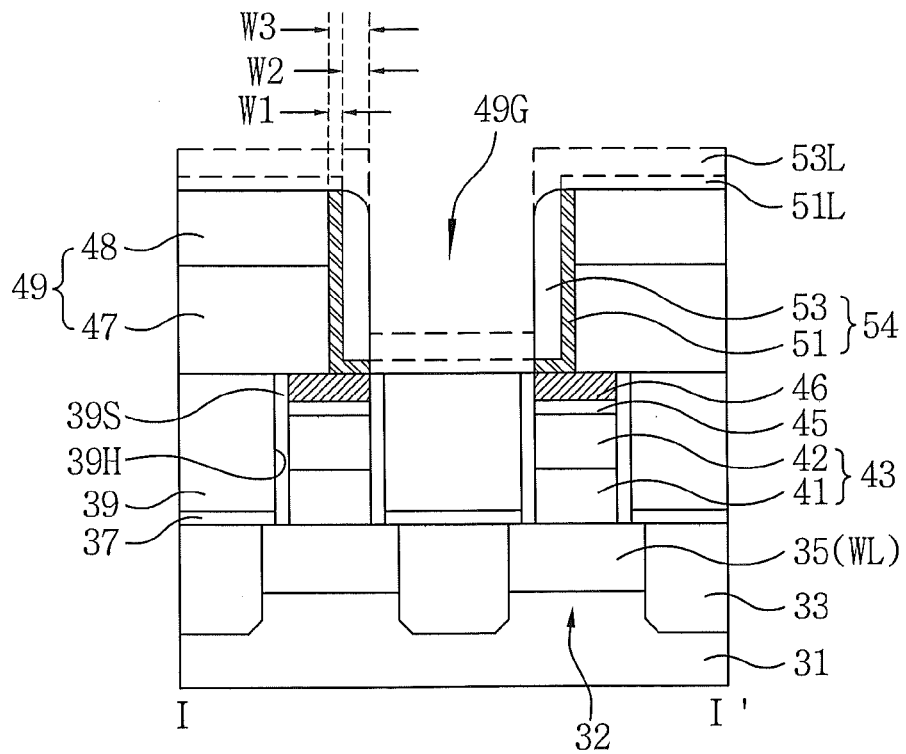

Referring to FIGS. 2 and 8, the exposed part of the bottom electrode layer 51L may be removed to form a preliminary bottom electrode 51 covering the sidewall of the first insulating pattern 49. The exposed part of the bottom electrode layer 51L may be removed using a wet cleansing process or dry etching process. The preliminary bottom electrode 51 may be interposed between the first insulating pattern 49 and the preliminary spacer 53. The preliminary bottom electrode 51 and the preliminary spacer 53 may constitute a preliminary bottom electrode structure 54.

The preliminary bottom electrode 51 and the preliminary spacer 53 may face each other. Viewed from a cross section, the preliminary bottom electrode 51 may have an L shape. The preliminary bottom electrode 51 may be in contact with the diode electrode 46. A top surface of the first insulating pattern 49 may be exposed. The lower insulating layer 39 may be exposed on the bottom of the groove 49G. The preliminary bottom electrode 51 may be formed to a first width W1 between the preliminary spacer 53 and the first insulating pattern 49. The preliminary spacer 53 may be formed to a second width W2. The preliminary bottom electrode structure 54 may be formed to a third width W3. The third width W3 of the preliminary bottom electrode structure 54 may be controlled by adjusting the thicknesses of the bottom electrode layer 51L and the spacer layer 53L. For example, the spacer layer 53L may be formed thicker than the bottom electrode layer 51L. The bottom electrode layer 51L may be formed to a thickness of about 1 nm to 10 nm. The spacer layer 53L may be formed to a thickness of about 5 nm to 50 nm.

In some embodiments, the preliminary spacer 53 may be omitted.

In other embodiments, partially removing the spacer layer 53L and removing the exposed part of the bottom electrode layer 51L may be performed using a consecutively performed anisotropic etching process.

Figure 9:
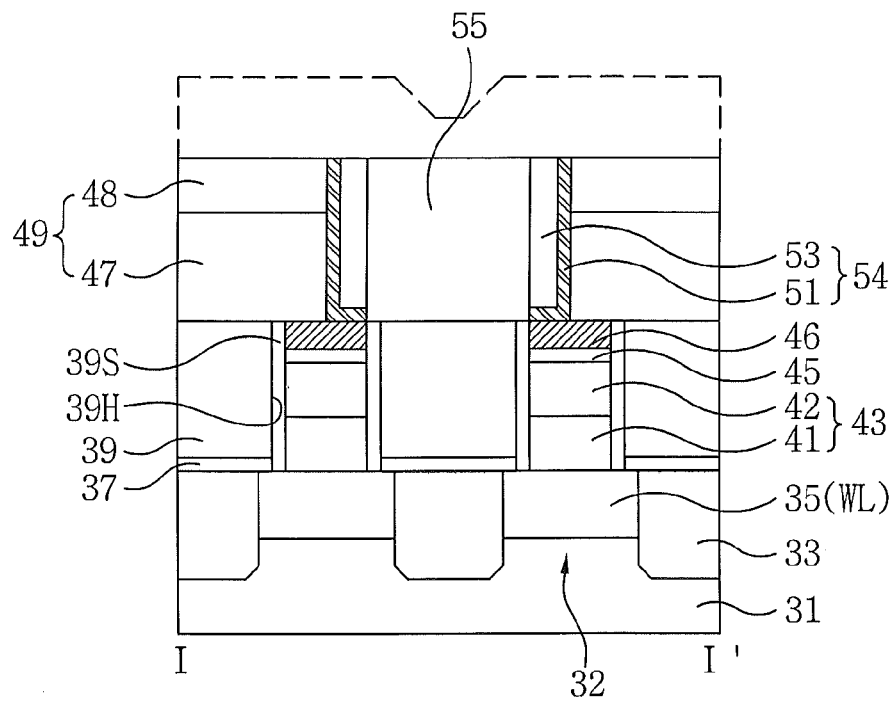
Figure 10:
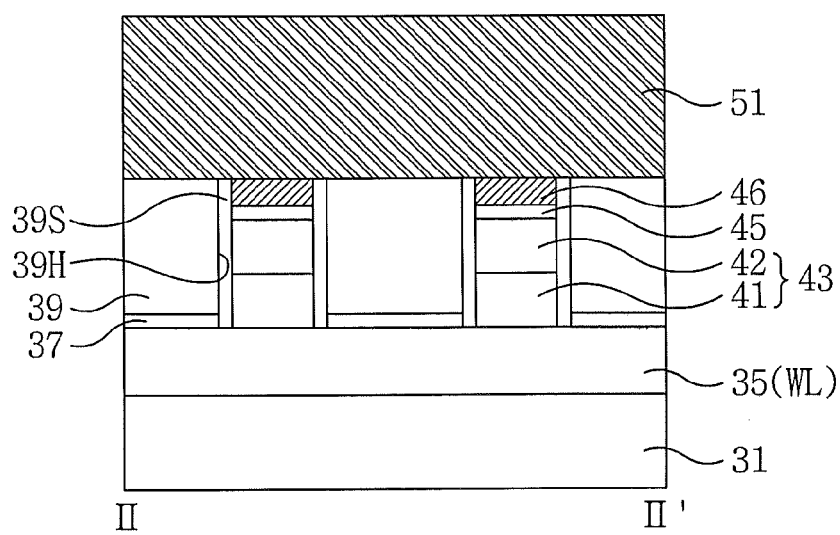
FIGS. 10 to 12 and 15 are cross-sectional views taken along line II-II' of FIG. 2 illustrating a method of forming a semiconductor device according to a second embodiment of the inventive concept.

Referring to FIGS. 2, 9 and 10, a second insulating pattern 55 filling the groove 49G may be formed. The second insulating pattern 55 may be formed of a material layer having an etch selectivity with respect to the preliminary spacer 53. The second insulating pattern 55 may be formed of a silicon oxide layer, a silicon nitride layer, and/or a silicon oxynitride layer. The second insulating pattern 55 may be formed using an insulating formation process and a planarization process.

As illustrated in FIG. 10, the plurality of diodes 43 and diode electrodes 46 may be arranged along the WL 35 at predetermined intervals. Accordingly, the preliminary bottom electrode 51 may be in contact with the two or more diode electrodes 46.

Figure 11:
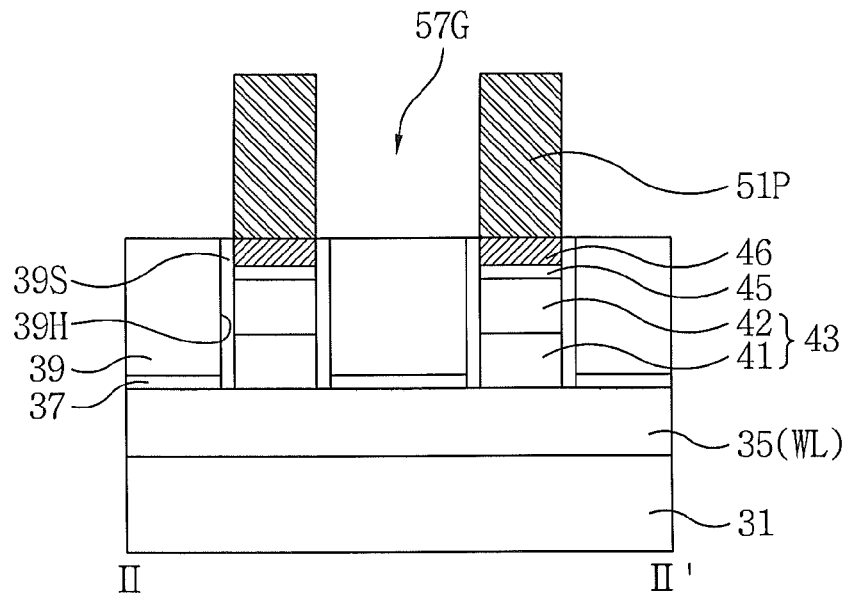

Referring to FIGS. 2 and 11, the first insulating pattern 49, the second insulating pattern 55, the preliminary spacer 53 and the preliminary bottom electrode 51 may be patterned to form a second groove 57G. As a result, the preliminary bottom electrode 51 may be divided into a plurality of patterned preliminary bottom electrodes 51P.

Figure 12:
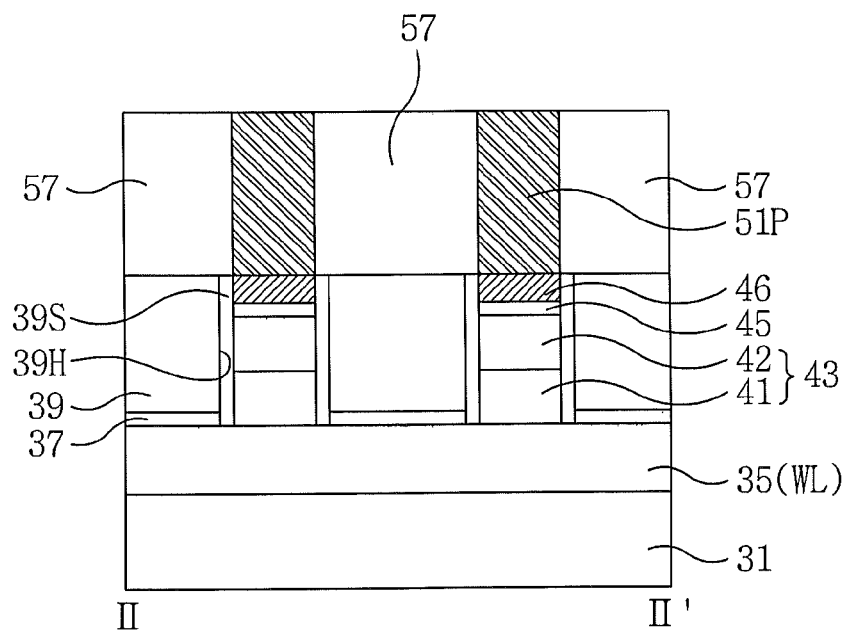

Referring to FIGS. 2 and 12, a third insulating pattern 57 filling the second groove 57G may be formed. The third insulating pattern 57 may be formed of a material layer having an etch selectivity with respect to the preliminary spacer 53. The third insulating pattern 57 may be formed of a silicon oxide layer, a silicon nitride layer, and/or a silicon oxynitride layer. For example, the third insulating pattern 57 may be formed of a silicon nitride layer. The third insulating pattern 57 may be formed using an insulating layer formation process and a planarization process. The planarization process may include a chemical mechanical polishing (CMP) method and/or an etching-back method.

The third insulating pattern 57 may be in the shape of a bar crossing the WL 35. In this case, the preliminary bottom electrode structure 54 may be divided into several structures. The preliminary bottom electrode structure 54 may be exposed between the first insulating pattern 49, the second insulating pattern 55, and the third insulating pattern 57.

Each of the patterned preliminary bottom electrodes 51P may be arranged on the diode electrode 46. While the patterned preliminary bottom electrodes 51P may be formed to have various widths, they will be described under the assumption that each of the patterned preliminary bottom electrodes 51P have a similar width to the diode electrode 46.

Figure 13:
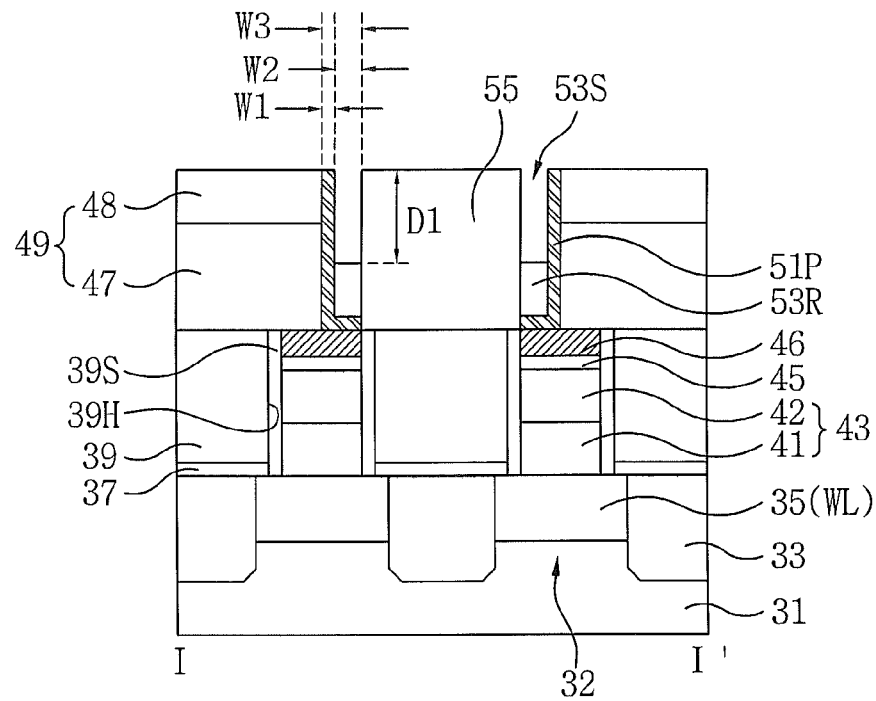

Referring to FIGS. 2 and 13, the preliminary spacer 53 may be partially removed to form a preliminary slit 53S between the second insulating pattern 55 and the patterned preliminary bottom electrode 51P. A spacer 53R may remain on a bottom part of the preliminary slit 53S. In some embodiments, the preliminary slit 53S may be referred to as an opening.

The preliminary spacer 53 may be partially removed using an etching-back process. For example, when the preliminary spacer 53 is formed of a polysilicon layer, a dry etching process may be used to partially remove the preliminary spacer 53. A sidewall of the patterned preliminary bottom electrode 51P may be exposed in the preliminary slit 53S. A bottom of the preliminary slit 53S may be formed at a lower level than the first oxide layer 48.

The preliminary slit 53S may have the second width W2 between the second insulating pattern 55 and the patterned preliminary bottom electrodes 51P. The first depth D1 of the preliminary slit 53S may be twice the first width W1 of the preliminary bottom electrodes 51P or greater. A sidewall of the preliminary bottom electrodes 51P may be exposed as much as the first depth D1 by the preliminary slit 53S.

Figure 14:
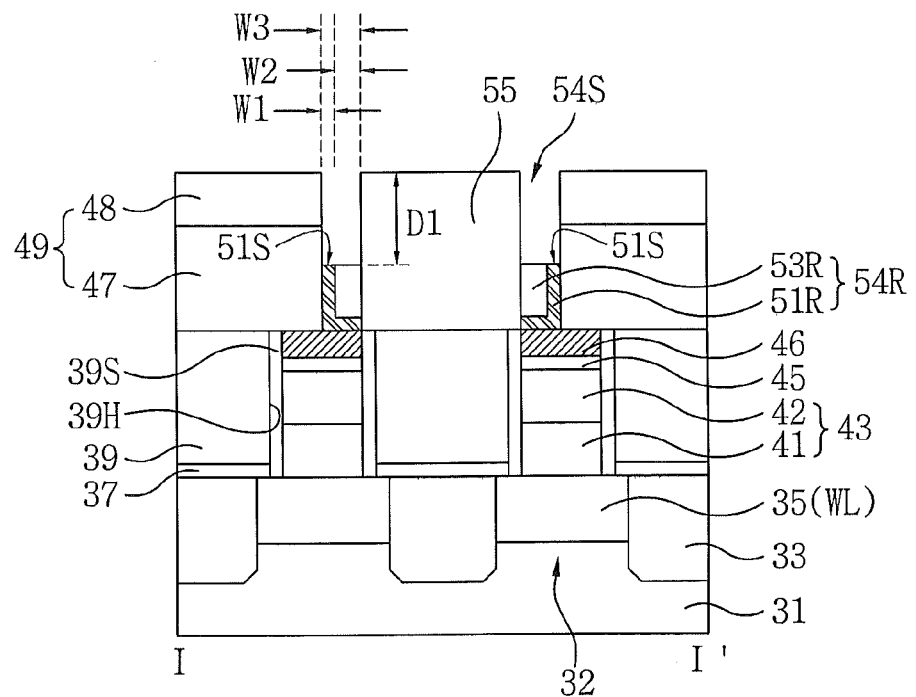
Figure 15:
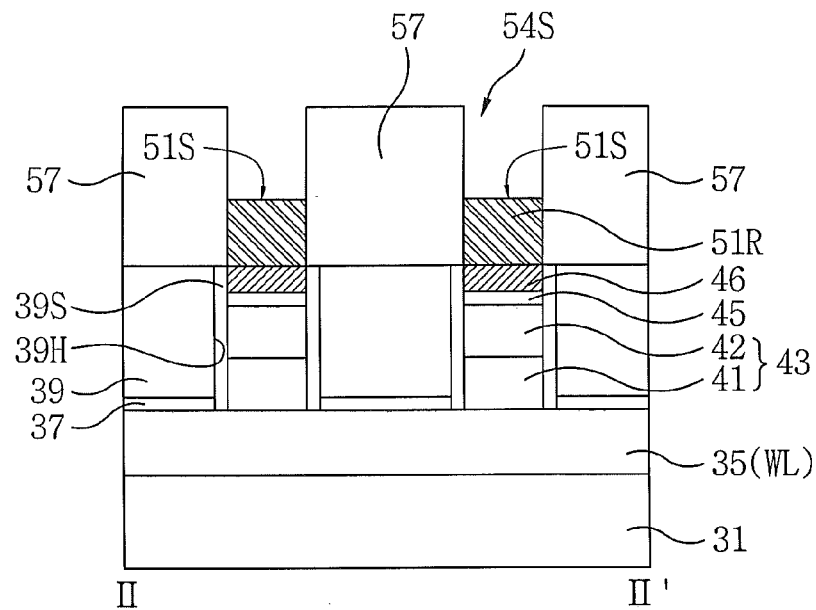

Referring to FIGS. 2, 14 and 15, the patterned preliminary bottom electrodes 51P may be partially removed to form a slit 54S between the first insulating pattern 49 and the second insulating pattern 55. A bottom electrode 51R may remain on a bottom part of the slit 54S. The bottom electrode 51R and the spacer 53R may constitute a bottom electrode structure 54R. The slit 54S may be self-aligned with the bottom electrode structure 54R. In some embodiments, the slit 54S may be referred to as an expanded opening.

In other embodiments, partially removing the preliminary spacer 53 and partially removing the preliminary bottom electrodes 51P may be alternately and repeatedly performed several times.

Partially removing the patterned preliminary bottom electrodes 51P may be performed using an isotropic etching process, such as a wet etching process. As described above, the first depth D1 of the preliminary slit 53S may be twice the first width W1 of the patterned preliminary bottom electrodes 51P or greater. While the isotropic etching process is performed, the exposed part of the patterned preliminary bottom electrodes 51P may be in uniform contact with an etching solution and/or an etching gas. Accordingly, a top surface 51S of the bottom electrode 51R may exhibit a generally uniform surface level. A plurality of bottom electrodes 51R two-dimensionally arranged in column and row directions may be provided on the semiconductor substrate 31. In this case, the top surfaces 51S of the bottom electrodes 51R may exhibit a generally uniform shape on the entire surface of the semiconductor substrate 31.

In some embodiments, the top surface 51S of the bottom electrode 51R may protrude to have a higher level than the spacer 53R. In other embodiments, the top surface 51S of the bottom electrode 51R may be formed to have a lower level than that of the spacer 53R. Furthermore, the top surface 51S may exhibit an upwardly inclined profile towards the first insulating pattern 49. That is, a region adjacent to the first insulating pattern 49 of the top surface 51S may be disposed at a higher level than a region adjacent to the spacer 53R of the top surface 51S. For example, the region adjacent to the first insulating pattern 49 of the top surface 51S may be disposed at a higher level than the spacer 53R, and the region adjacent to the spacer 53R of the top surface 51S may be disposed at a lower level than the top surface of the spacer 53R.

Figure 16:
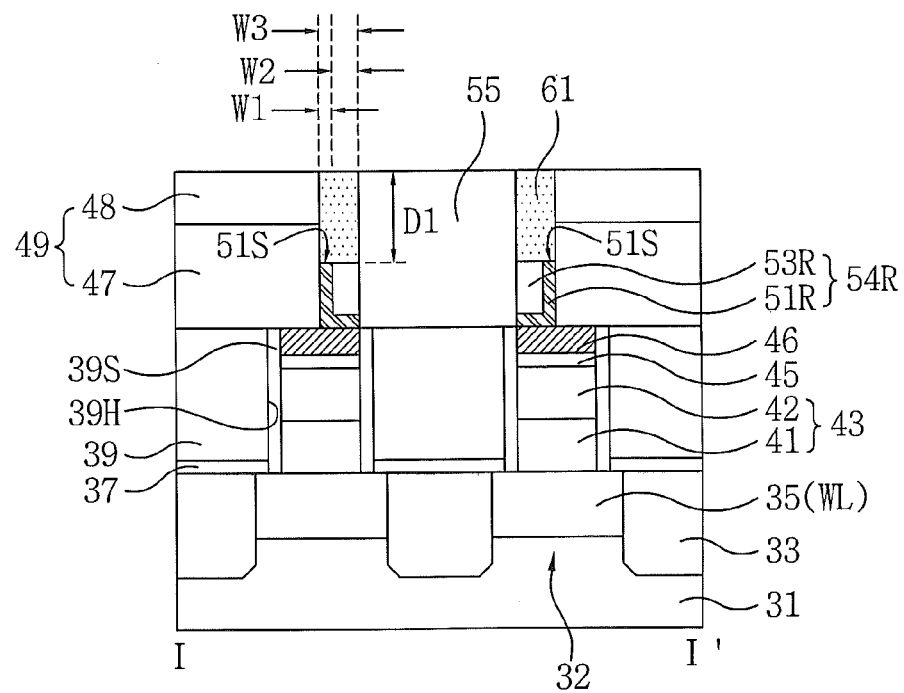

Referring to FIGS. 2 and 16, a data storage plug 61 filling the slit 54S may be formed. The data storage plug 61 may be self-aligned with the bottom electrode structure 54R. The data storage plug 61 may be in contact with the bottom electrode 51R. As described above, the bottom electrode 51R may have a top surface 51S having a generally uniform surface level. Accordingly, a contact area between the data storage plug 61 and the bottom electrode 51R may be relatively reduced. Further, the contact area between the data storage plug 61 and the bottom electrode 51R may be generally uniformly distributed on the entire surface of the semiconductor substrate 31. Forming the data storage plug 61 may include a process of forming a data storage material and a process of planarization. The planarization process may include a CMP method and/or an etching-back method.

The data storage plug 61 may have a third width W3 between the first insulating pattern 49 and the second insulating pattern 55. The data storage plug 61 may be formed to the first depth D1. The first depth D1 may be formed to about 20 nm to 100 nm. For example, the first width W1 of the bottom electrode 51R may be about 4 nm, and the second width W2 of the spacer 53R may be about 15 nm.

Referring again to FIGS. 2, 3 and 4, an upper electrode 63 may be formed on the data storage plug 61. An upper insulating layer 65 covering the upper electrode 63 may be formed. BLs 67 may be formed in the upper insulating layer 65. Each of the BLs 67 may be electrically connected to the data storage plug 61 via the upper electrode 63. In some embodiments, when the upper electrode 63 is omitted, the BLs 67 may be directly connected to the data storage plug 61.

The upper electrode 63 may be formed of a material selected from the group consisting of a W layer, a WN layer, a WSi layer, a Ti layer, a TiN layer, a TiAlN layer, a TiCN layer, a TiSiN layer, a TiON layer, a Ta layer, a TaN layer, a TaAlN layer, a TaCN layer, a TaSiN layer, a C layer, a CN layer, a CoSi layer and combinations thereof. The upper insulating layer 65 may be formed of a silicon oxide layer, a silicon nitride layer, and/or a silicon oxynitride layer. The BLs 67 may be formed of a material selected from the group consisting of a W layer, a WN layer, a WSi layer, a Ti layer, a TiN layer, a TiAlN layer, a TiCN layer, a TiSiN layer, a TiON layer, a Ta layer, a TaN layer, a TaAlN layer, a TaCN layer, a TaSiN layer, a C layer, a CN layer, a CoSi layer, an Al layer, a Cu layer, and combinations thereof.

THIRD EMBODIMENT

FIGS. 17 to 21 are cross-sectional views taken along line II-II' of FIG. 2 illustrating a method of forming a semiconductor device according to a third embodiment of the inventive subject matter.

Figure 17:
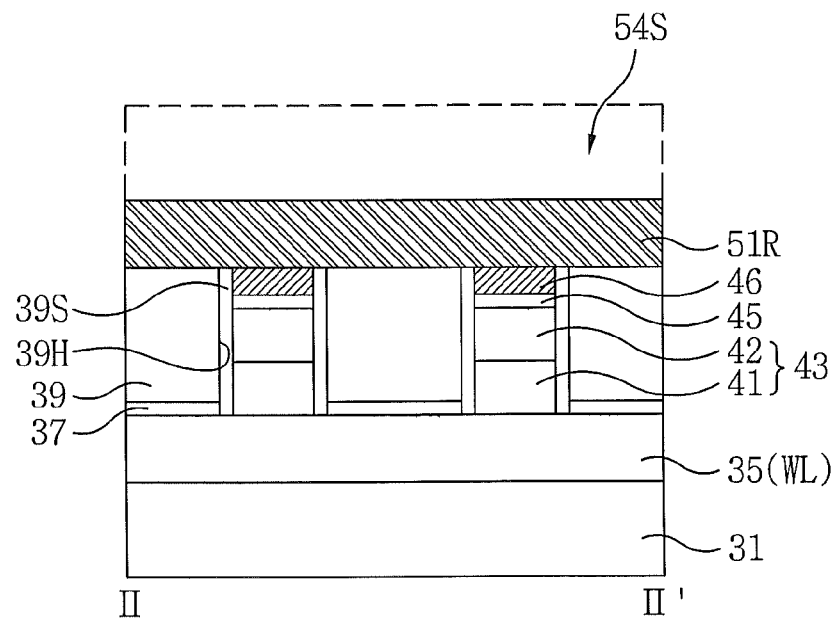
FIGS. 17 to 21 are cross-sectional views taken along line II-II' of FIG. 2 illustrating a method of forming a semiconductor device according to a third embodiment of the inventive concept.

Referring to FIG. 17, a method of forming a semiconductor device according to a third embodiment includes forming active regions 32, an isolation layer 33, WLs 35, an etch stop layer 37, a lower insulating layer 39, diode holes 39H, contact spacers 39S, a first semiconductor pattern 41, a second semiconductor pattern 42, a diode 43, a metal silicide pattern 45, a diode electrode 46, a first nitride layer 47, a first oxide layer 48, a first insulating pattern 49, a groove 49G, a preliminary bottom electrode 51, a preliminary spacer 53, a preliminary bottom electrode structure 54, and a second insulating pattern 55 on a semiconductor substrate 31. Only differences from the second embodiment will be described below.

The preliminary bottom electrode 51 may be partially removed to form a slit 54S. A bottom electrode 51R may remain on a bottom part of the slit 54S. Partially removing the preliminary bottom electrode 51 may be performed using a similar method to those described in FIGS. 13 and 14. That is, a method in which the preliminary spacer 53 is partially removed to form a spacer (not shown) and a preliminary slit (not shown), and then the preliminary bottom electrode 51 is partially removed may be used.

Figure 18:
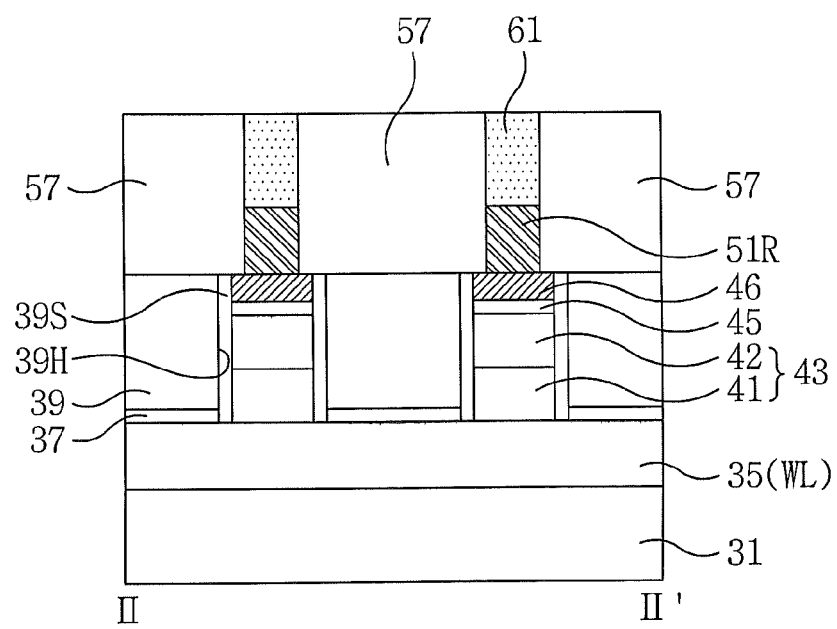

Referring to FIG. 18, a data storage material layer filling the slit 54S may be formed, and the data storage material layer may be patterned to form a plurality of data storage plugs 61. Afterwards, the bottom electrode 51R may be patterned to be divided into several electrodes. As a result, the bottom electrode 51R may be arranged on the diode electrode 46. While the bottom electrode 51R is patterned, the preliminary spacer (not shown) may be patterned to be divided into several patterns. The data storage plug 61 may be self-aligned with the bottom electrode 51R. A third insulating pattern 57 may be formed between the data storage plug 61 and the bottom electrode 51R. The data storage plug 61 and the bottom electrode 51R may be formed to have narrower widths than the diode electrode 46.

Figure 19:
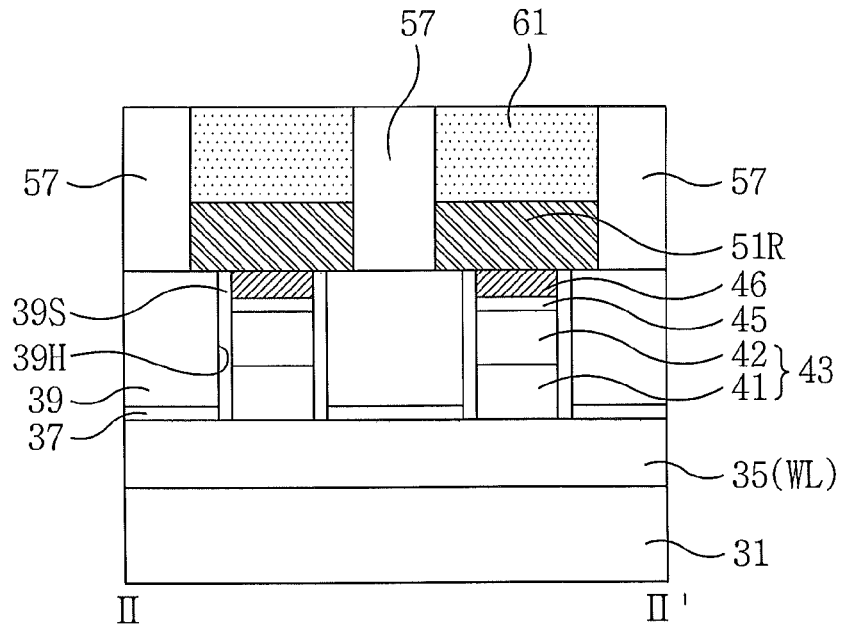

As illustrated in FIG. 19, the data storage plug 61 and the bottom electrode 51R may be formed to have greater widths than the diode electrode 46.

Figure 20:
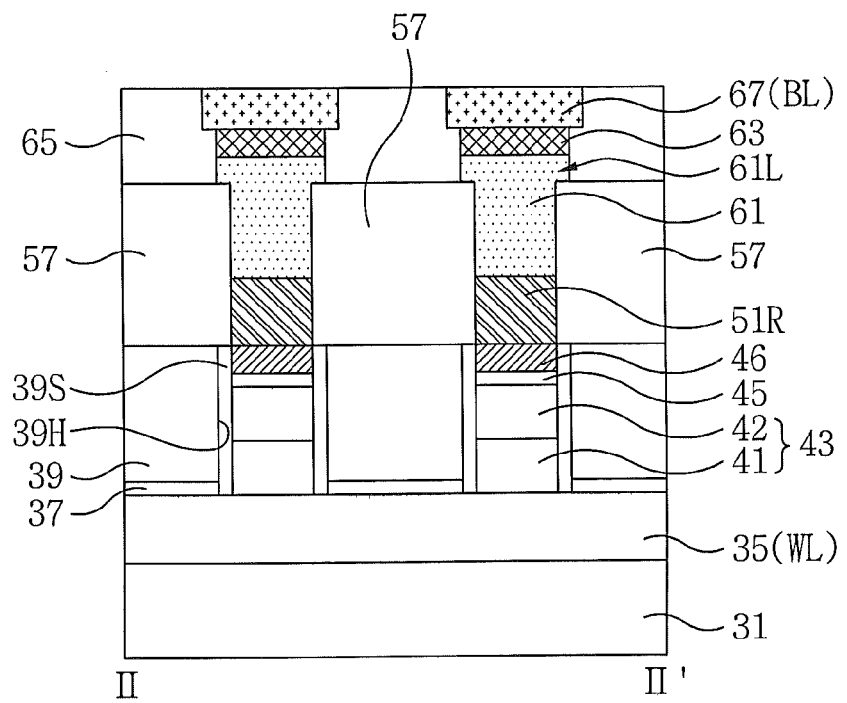

Referring to FIG. 20, a method of forming a semiconductor device may include forming active regions 32, an isolation layer 33, WLs 35, an etch stop layer 37, a lower insulating layer 39, diode holes 39H, contact spacers 39S, a first semiconductor pattern 41, a second semiconductor pattern 42, a diode 43, a metal silicide pattern 45, a diode electrode 46, a first nitride layer 47, a first oxide layer 48, a first insulating pattern 49, a groove 49G, a second insulating pattern 55, a third insulating pattern 57, a bottom electrode 51R, a spacer 53R, a bottom electrode structure 54R, and a slit 54S on a semiconductor substrate 31. Only differences from the second embodiment will be briefly described below.

A data storage plug 61 filling the slit 54S and a data storage pattern 61L extending on the data storage plug 61 may be formed. An upper electrode 63 may be formed on the data storage pattern 61L. For example, the data storage plug 61, the data storage pattern 61L and the upper electrode 63 may be formed by filling the slit 54S, forming a data storage material layer covering the semiconductor substrate 31, forming an upper electrode layer covering the data storage material layer, and consecutively patterning the upper electrode layer and the data storage material layer.

Then, an upper insulating layer 65 and a BL 67 may be formed. The data storage pattern 61L may be in parallel to the BL 67.

Figure 21:
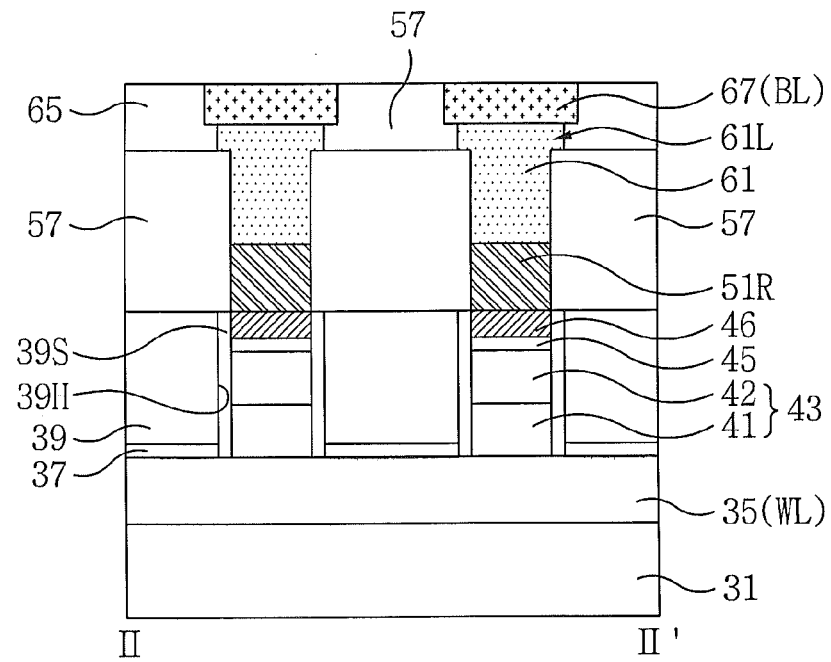

As illustrated in FIG. 21, the upper electrode 63 may be omitted. In this case, the BL 67 may be in contact with the data storage pattern 61L.

FOURTH EMBODIMENT

A method of forming a semiconductor device according to a fourth embodiment of the inventive concept will be described with reference to FIGS. 22 to 31.

Figure 22:
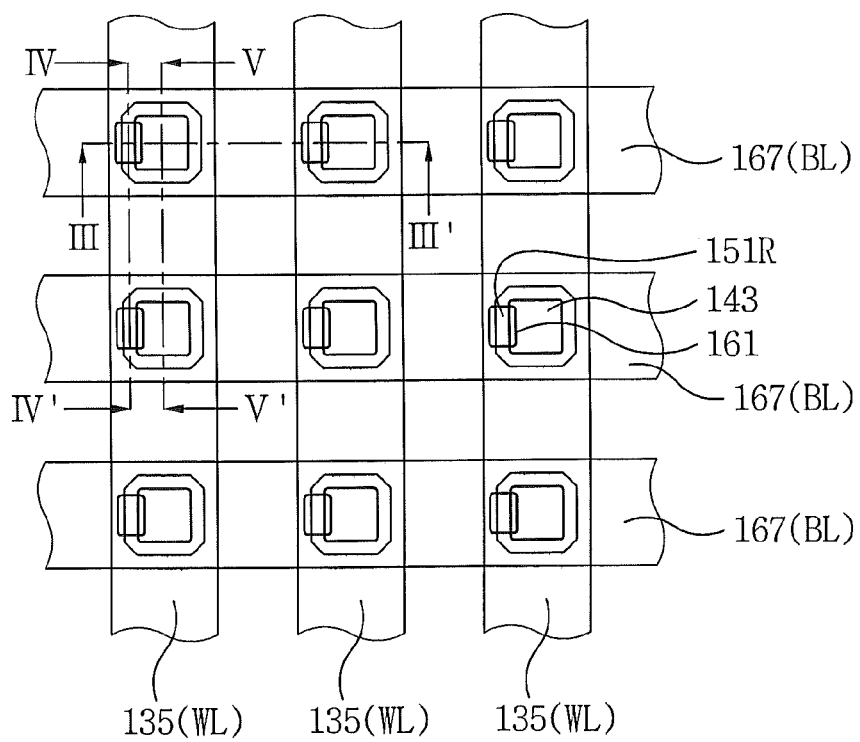
FIG. 22 is a layout illustrating a method of forming a semiconductor device according to a fourth embodiment of the inventive concept.

Referring to FIG. 22, WLs 135 may be arranged two-dimensionally in parallel to each other in a cell array region of a semiconductor device. BLs 167 may be disposed so as to cross WLs 135. Diodes 143, bottom electrodes 151R, and data storage plugs 161 may be disposed at intersections of the WLs 135 and the BLs 167.

Figure 23:
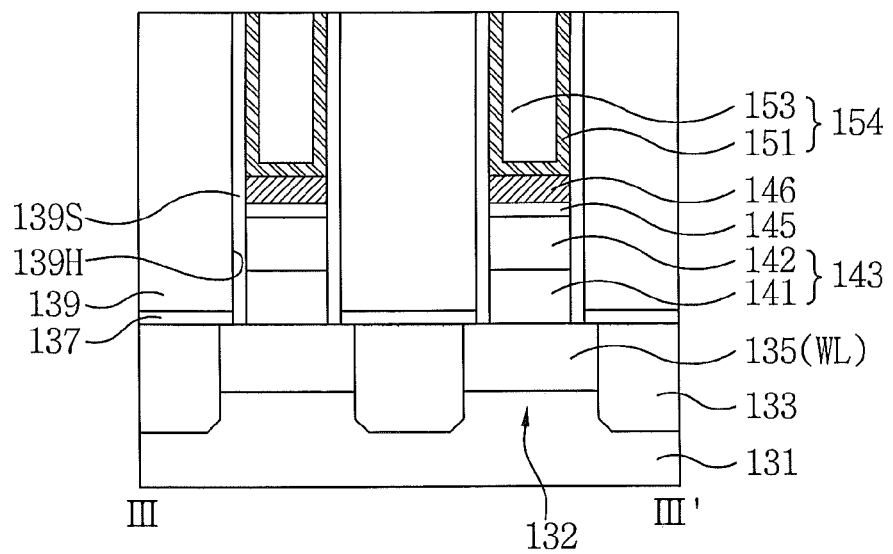
FIGS. 23, 24, 28, and 30 are cross-sectional views taken along line of FIG. 22 illustrating a method of forming a semiconductor device according to a fourth embodiment of the inventive concept.

Referring to FIGS. 22 and 23, an isolation layer 133 defining active regions 132 may be formed in a predetermined region of the semiconductor substrate 131. The WLs 135 may be formed in the active regions 132. An etch stop layer 137 and a lower insulating layer 139 may be sequentially formed on the semiconductor substrate 131 having the WLs 135. Contact holes 139H penetrating the lower insulating layer 139 and the etch stop layer 137 to expose the WLs 135 may be formed. Contact spacers 139S may be formed on sidewalls of the contact holes 139H. A first semiconductor pattern 141 and a second semiconductor pattern 142 may be sequentially stacked in each of the contact holes 139H. The first semiconductor pattern 141 and the second semiconductor pattern 142 may constitute a diode 143. A metal silicide pattern 145 and a diode electrode 146 may be sequentially formed on the diode 143. Only differences from the second embodiment will be briefly described below.

The diode electrode 146 may be formed at a lower level than a top surface of the lower insulating layer 139. A preliminary bottom electrode 151 and a preliminary resistive pattern 153 may be formed in the contact holes 139H on the diode electrode 146. The preliminary bottom electrode 151 and the preliminary resistive pattern 153 may constitute a preliminary bottom electrode structure 154.

Specifically, the preliminary bottom electrode 151 and the preliminary resistive pattern 153 may be formed by forming a bottom electrode layer covering sidewalls and a bottom of the contact hole 139H and covering a top surface of the lower insulating layer 139, forming a resistive material layer filling the contact hole 139H on the bottom electrode layer, and planarizing the resistive material layer and the bottom electrode layer until the lower insulating layer 139 is exposed.

The planarization may be performed using a CMP method and/or an etching-back method.

The preliminary resistive pattern 153 may be formed of a material layer exhibiting a higher electrical resistance than the preliminary bottom electrode 151. Also, the preliminary resistive pattern 153 may be formed of a material layer having an etch selectivity with respect to the lower insulating layer 139. The preliminary resistive pattern 153 may be formed of a material selected from the group consisting of a Si layer, a SiO layer, a SiN layer, a SiON layer, a C layer, a SiC layer, a CN layer, a HfO layer, and a TiO layer. For example, the preliminary resistive pattern 153 may be formed of a polysilicon layer.

Figure 24:
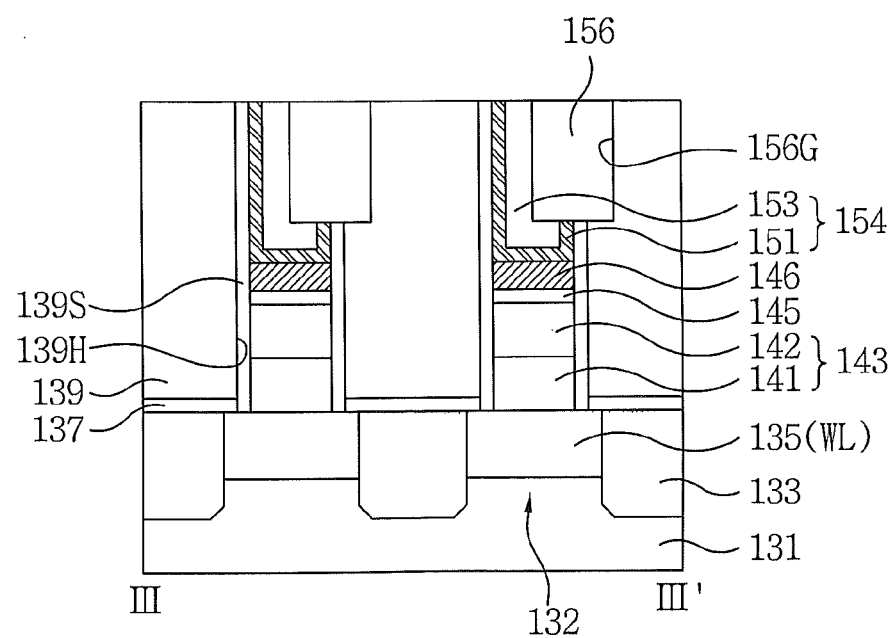
Figure 25:
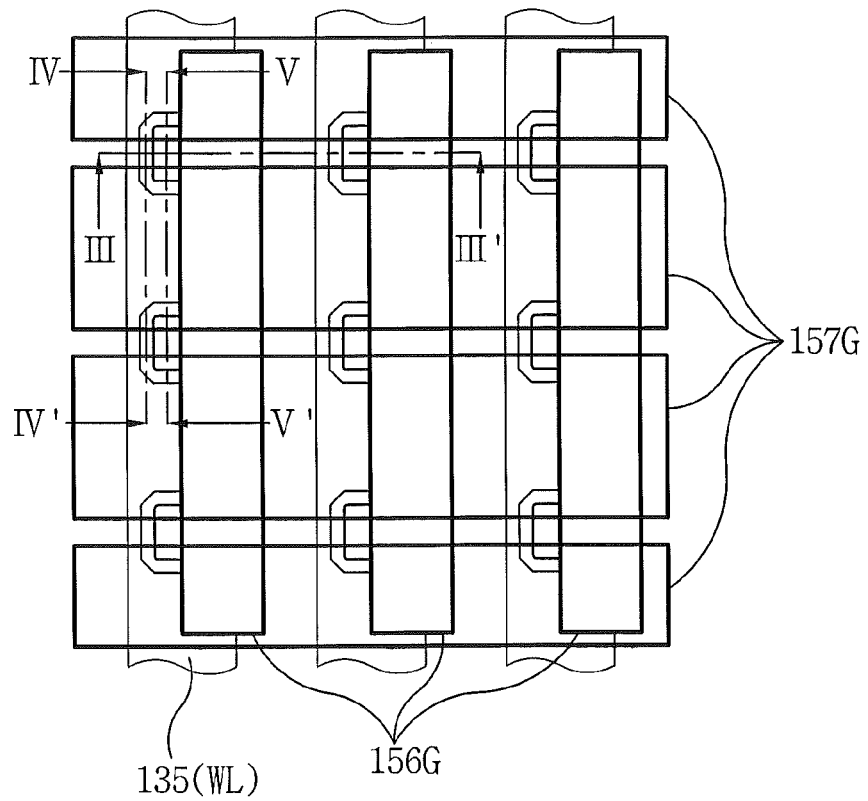
FIG. 25 is a layout illustrating the progress of an interim process to describe a method of forming a semiconductor device according to a fourth embodiment of the inventive concept.
Figure 26:
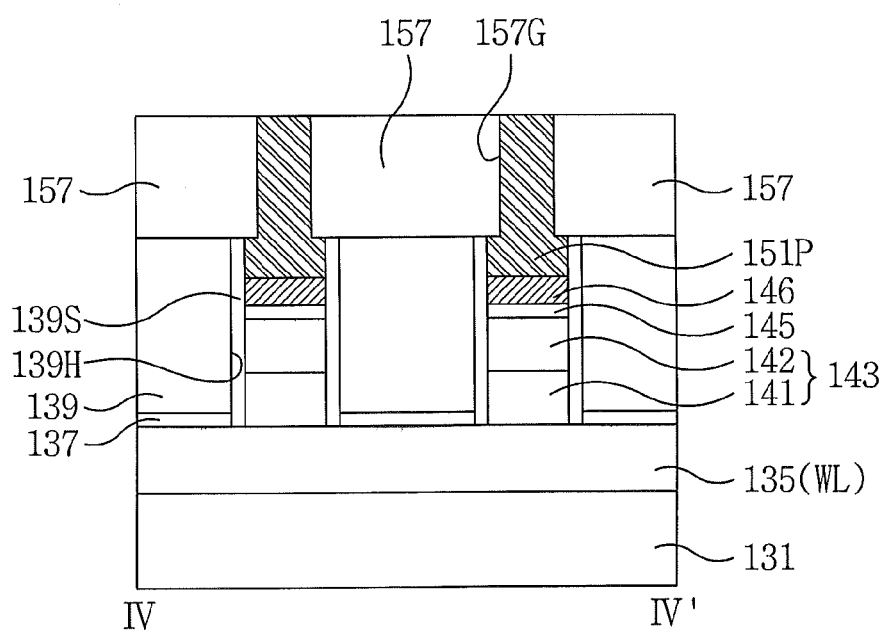
FIGS. 26, 29, and 31 are cross-sectional views taken along line IV-IV' of FIG. 22 illustrating a method of forming a semiconductor device according to a fourth embodiment of the inventive concept.
Figure 27:
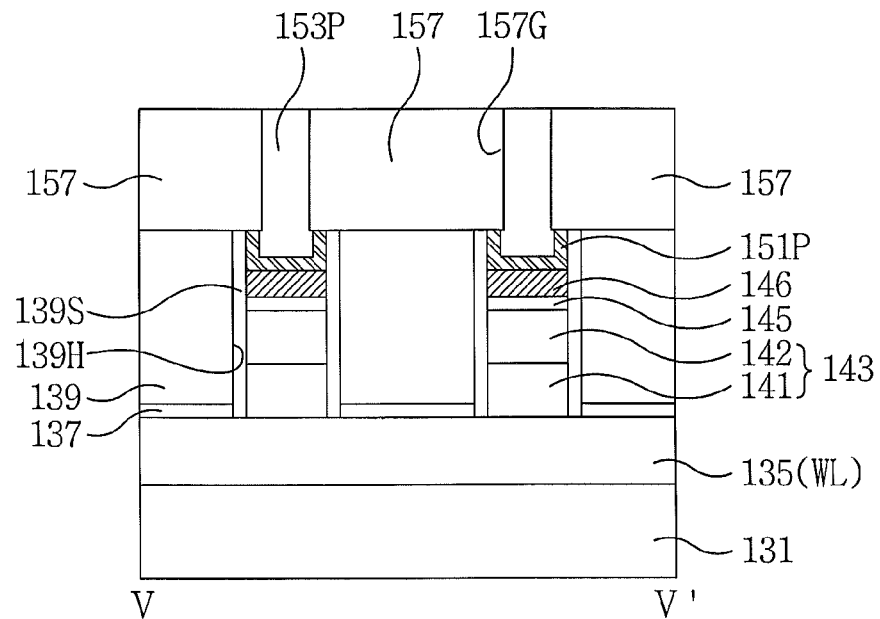
FIG. 27 is a cross-sectional view taken along line V-V' of FIG. 22 illustrating a method of forming a semiconductor device according to a fourth embodiment of the inventive concept.
Figure 28:
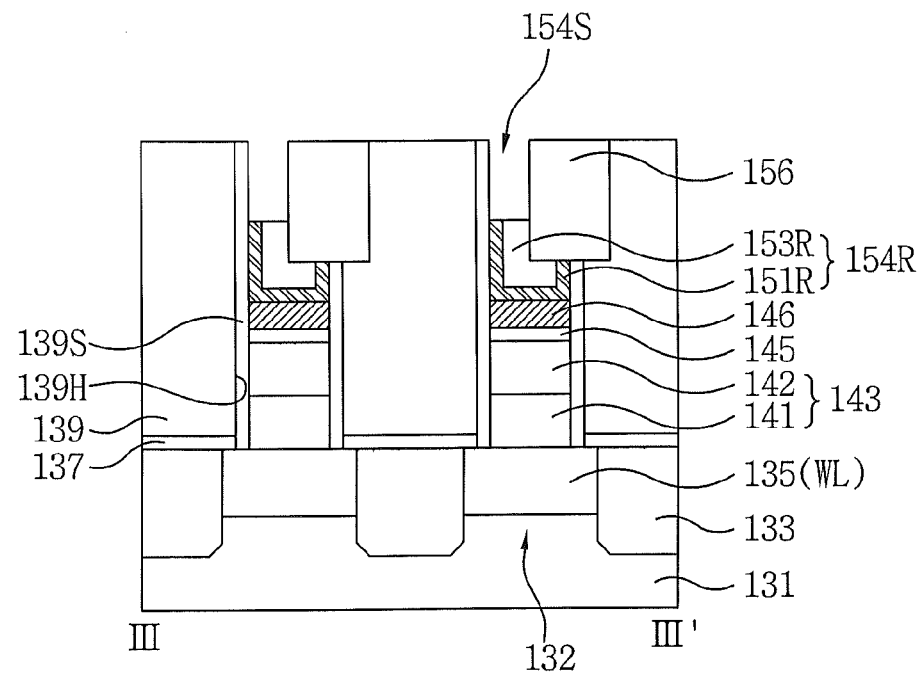
Figure 29:
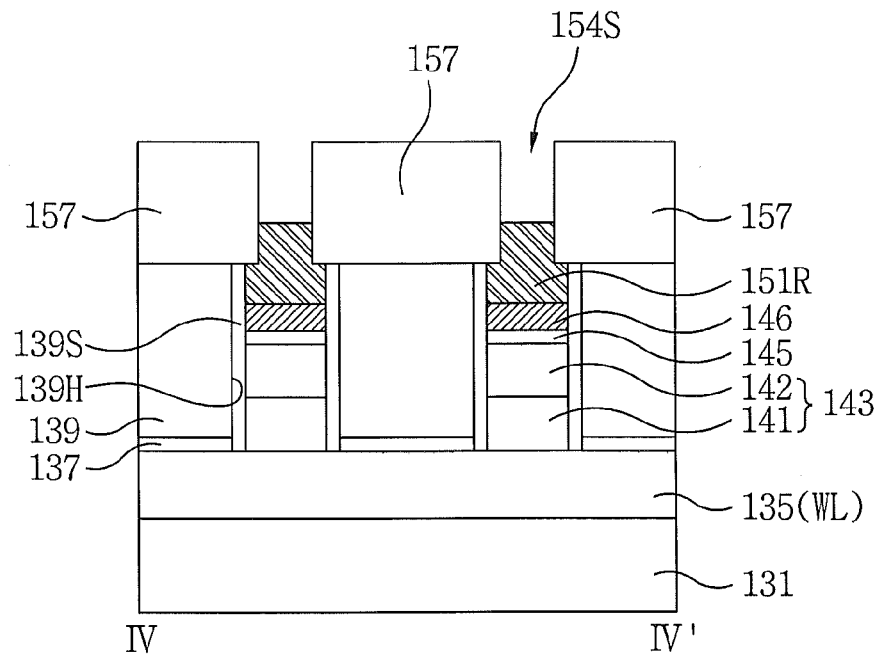
Figure 30:
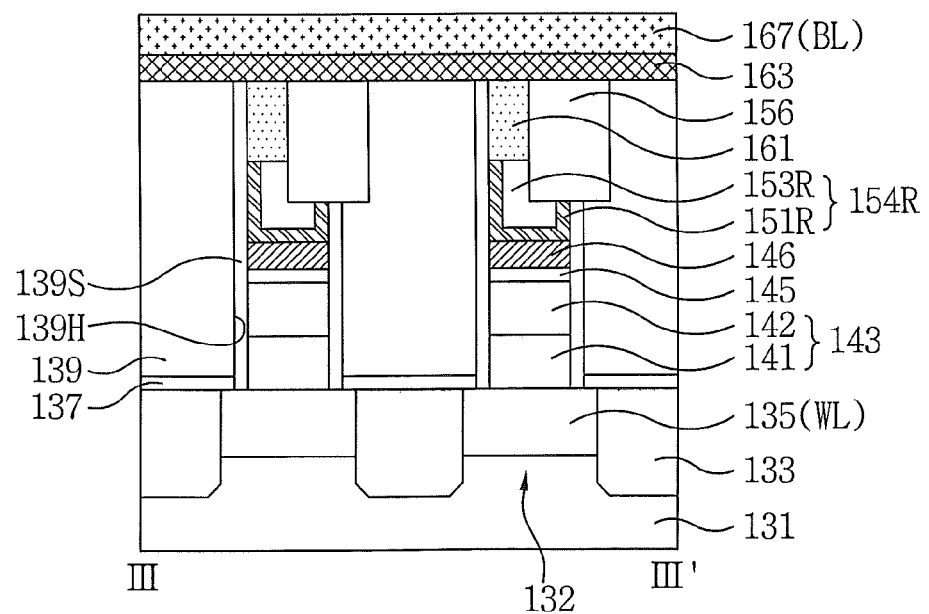
Figure 31:
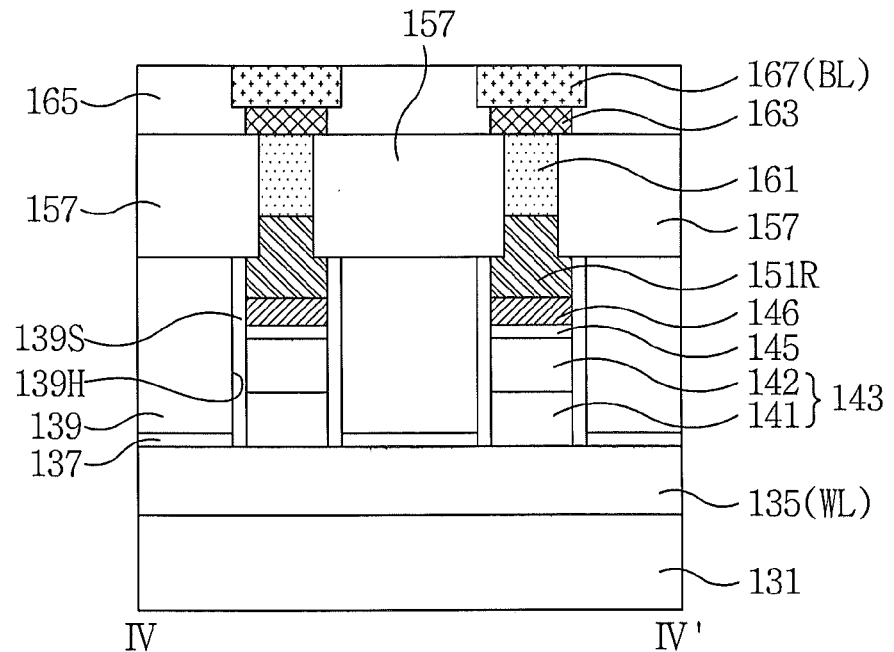

Referring to FIGS. 22, 24 and 25, the lower insulating layer 139 may be referred to as a first insulating pattern. The preliminary bottom electrode 151, the preliminary resistive pattern 153, and the lower insulating layer 139 may be patterned to form a first groove 156G, and a second insulating pattern 156 filling the first groove 156O may be formed. The second insulating pattern 156 may partially cross the preliminary bottom electrode 151 and the preliminary resistive pattern 153. The second insulating pattern 156 may be formed of a material layer having an etch selectivity with respect to the preliminary resistive pattern 153. As illustrated in FIG. 22, the second insulating pattern 156 may exhibit a constitution parallel to the WLs 135.

Referring to FIGS. 22, 25, 26 and 27, the preliminary bottom electrode 151, the preliminary resistive pattern 153, the lower insulating layer 139, and the second insulating pattern 156 may be patterned to form a second groove 157G, and a third insulating pattern 157 filling the second groove 157G may be formed. The third insulating pattern 157 may cross the WLs 135. As a result, the preliminary bottom electrode 151 and the preliminary resistive pattern 153 may be patterned to form a patterned preliminary bottom electrode 151P and a patterned preliminary resistive pattern 153P between the lower insulating layer 139, the second insulating pattern 156, and the third insulating pattern 157. The third insulating pattern 157 may be formed of a material layer having an etch selectivity with respect to the preliminary resistive pattern 153.

Referring to FIGS. 22, 25, 28 and 29, the patterned preliminary bottom electrode 151P and the patterned preliminary resistive pattern 153P may be partially removed to form a slit 154S. A bottom electrode 151R and a resistive pattern 153R may remain on a bottom part of the slit 154S. The bottom electrode 151R and the resistive pattern 153R may constitute a bottom electrode structure 154R. The slit 154S may be formed in a similar manner to a method described with reference to FIGS. 13 and 14, i.e., by partially removing the patterned preliminary resistive pattern 153P to form a preliminary slit, and by partially removing the patterned preliminary bottom electrode 151P. The resistive pattern 153R may be referred to as a resistive spacer or a spacer.

Referring to FIGS. 22, 25, 30 and 31, a data storage plug 161 filling the slit 154S may be formed. The data storage plug 161 may be self-aligned with the bottom electrode structure 154R. The data storage plug 161 may be in contact with the bottom electrode 151R. An upper electrode 163 may be formed on the data storage plug 161. An upper insulating layer 165 covering the upper electrode 163 may be formed. BLs 167 may be formed in the upper insulating layer 165. The data storage plug 161 may be formed at a lower level than bottom surfaces of the second insulating pattern 156 and the third insulating pattern 157. A top surface of the data storage plug 161 may be formed to have about the same height as top surfaces of the lower insulating layer 139, the second insulating pattern 156 and the third insulating pattern 157.

FIFTH EMBODIMENT

Figure 32:
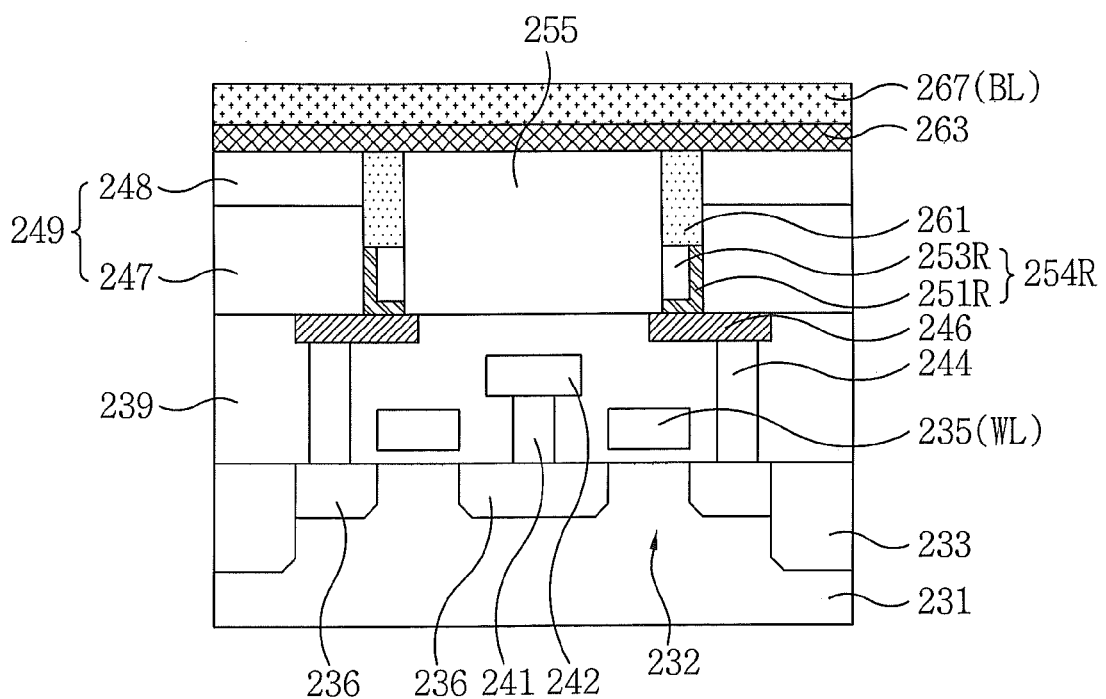
FIG. 32 is a cross-sectional view of a semiconductor device according to a fifth embodiment of the inventive concept.

FIG. 32 is a cross-sectional view of a semiconductor device according to a fifth embodiment.

Referring to FIG. 32, an isolation layer 233 defining active regions 232 may be formed in a predetermined region of the semiconductor substrate 231. WLs 235 crossing the active regions 232 may be formed. Source/drain regions 236 may be formed in the active region 232 adjacent to both sides of the WL 235. A lower insulating layer 239 covering the WL 235 may be formed. A source plug 241 and a source line 242 may be formed in the lower insulating layer 239. The source plug 241 may be connected to the source/drain regions 236 and/or the source line 242. A drain plug 244 and a landing pad 246 may be formed in the lower insulating layer 239. The drain plug 244 may be connected to the other one of the source/drain regions 236 and the landing pad 246. The landing pad 246 may be formed of a conductive pattern selected from the group consisting of a W layer, a WN layer, a WSi layer, a Ti layer, a TiN layer, a TiAlN layer, a TiCN layer, a TiSiN layer, a TiON layer, a Ta layer, a TaN layer, a TaAlN layer, a TaCN layer, a TaSiN layer, a C layer, a CN layer, a CoSi layer and combinations thereof.

Top surfaces of the lower insulating layer 239 and the landing pad 246 may be exposed on the same plane. The active region 232, the source/drain regions 236, and the WL 235 may constitute a transistor. The transistor may function as a switching device.

In a similar manner to that described with reference to FIGS. 2 to 16, a first nitride layer 247, a first oxide layer 248, a first insulating pattern 249, a second insulating pattern 255, a third insulating pattern (not shown), a bottom electrode 251R, a spacer 253R, a bottom electrode structure 254R, a data storage plug 261, an upper electrode 263, an upper insulating layer (not shown), and a BL 267 may be formed on the lower insulating layer 239 and the landing pad 246. The bottom electrode 251R may be in contact with the landing pad 246.

SIXTH EMBODIMENT

Figure 33:
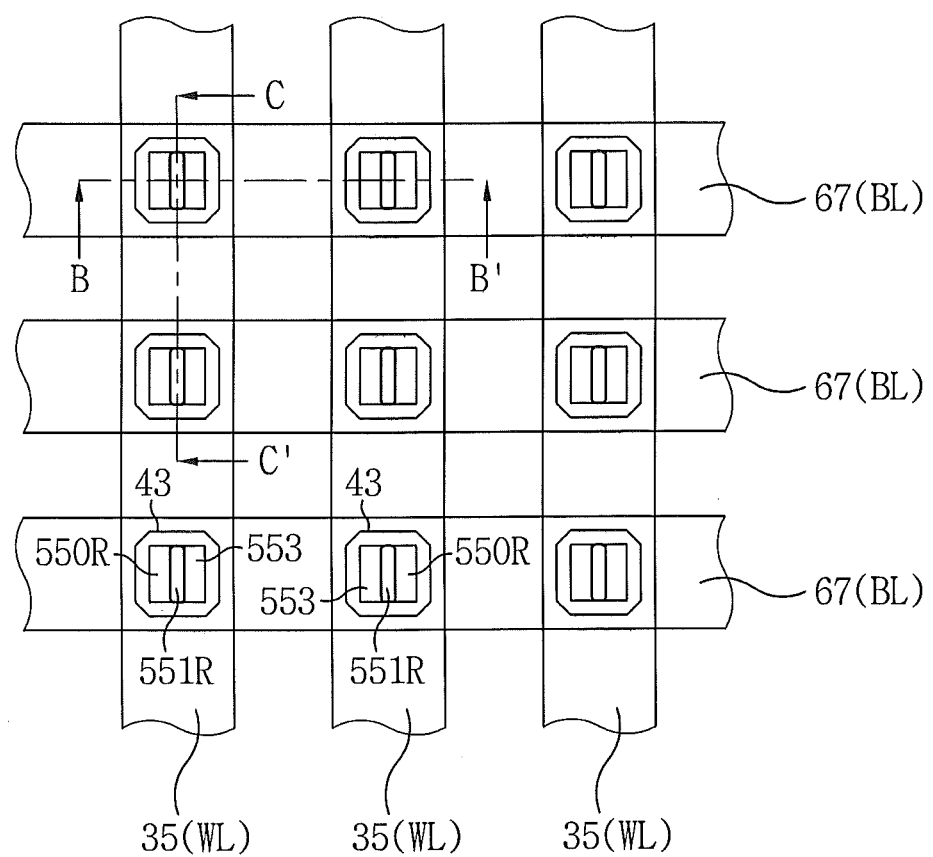
FIG. 33 is a layout diagram of a semiconductor device according to a sixth embodiment of the inventive concept.
Figure 34:
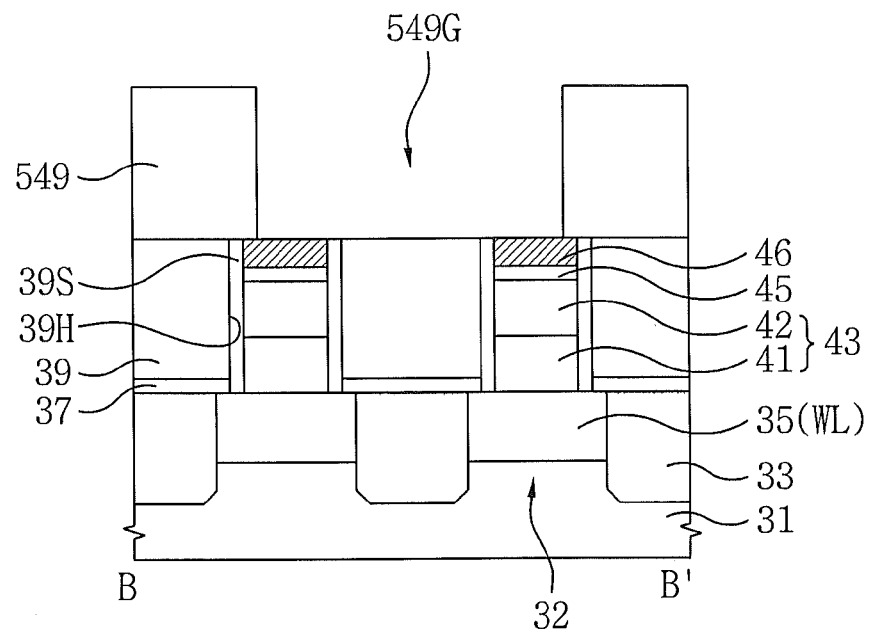
FIGS. 34 to 41D are cross-sectional views illustrating a method of fabricating a semiconductor device according to a sixth embodiment of the inventive concept.
Figure 39A:
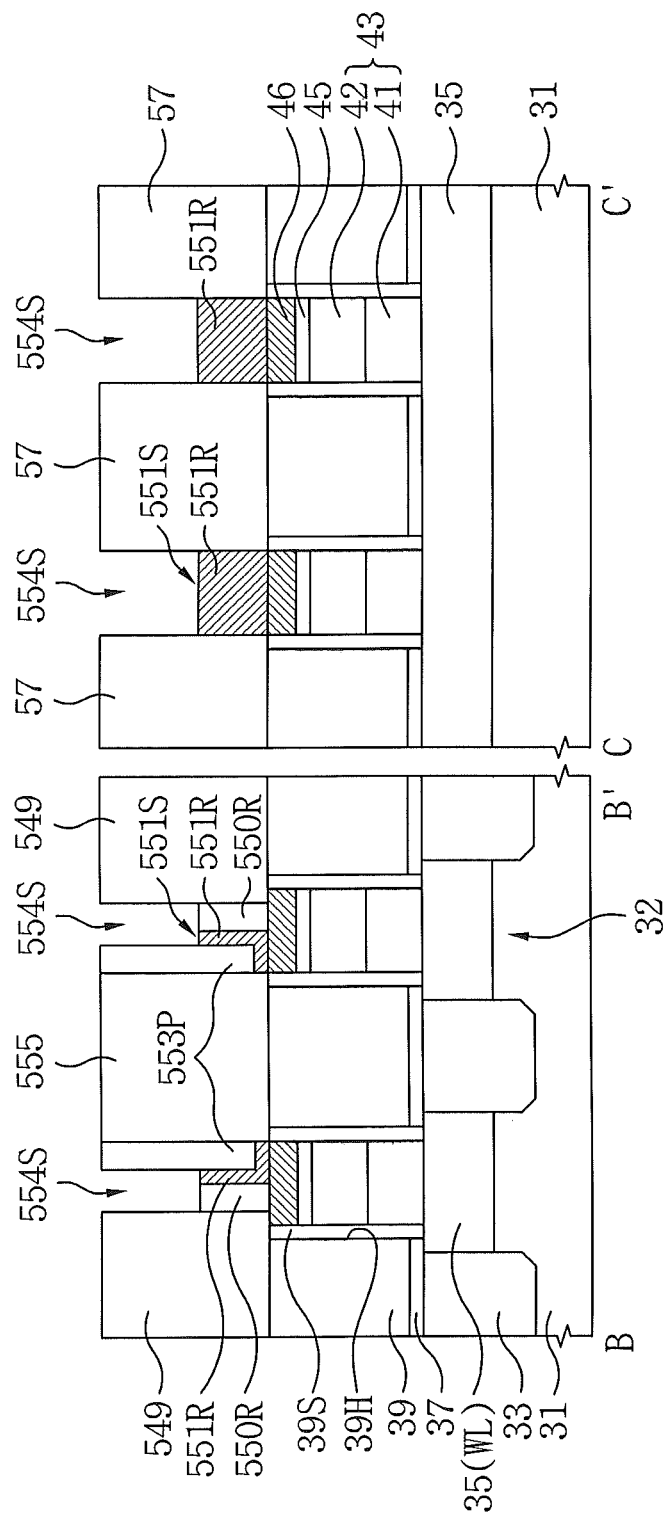
Figure 39B:
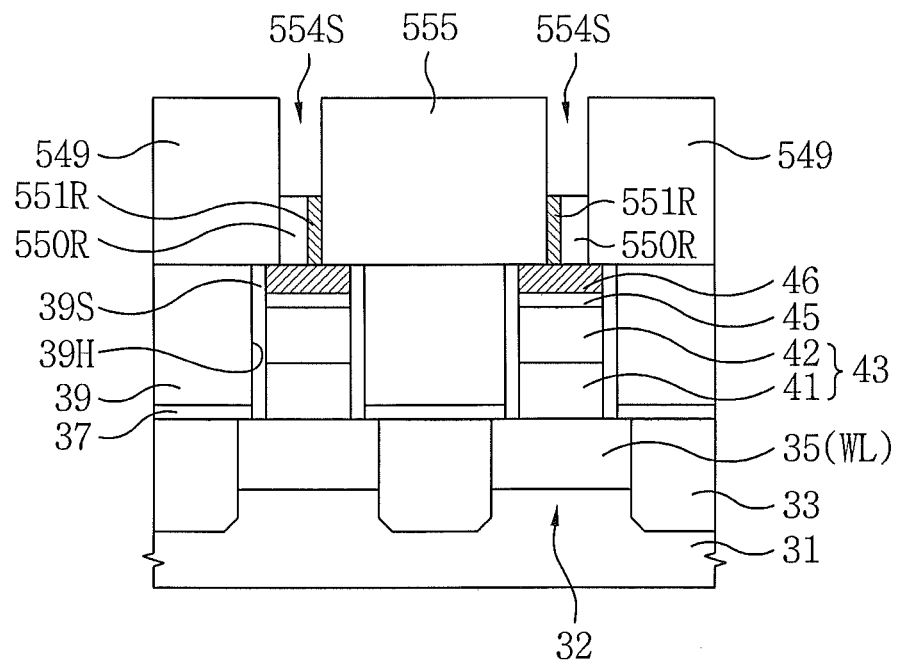
Figure 39C:
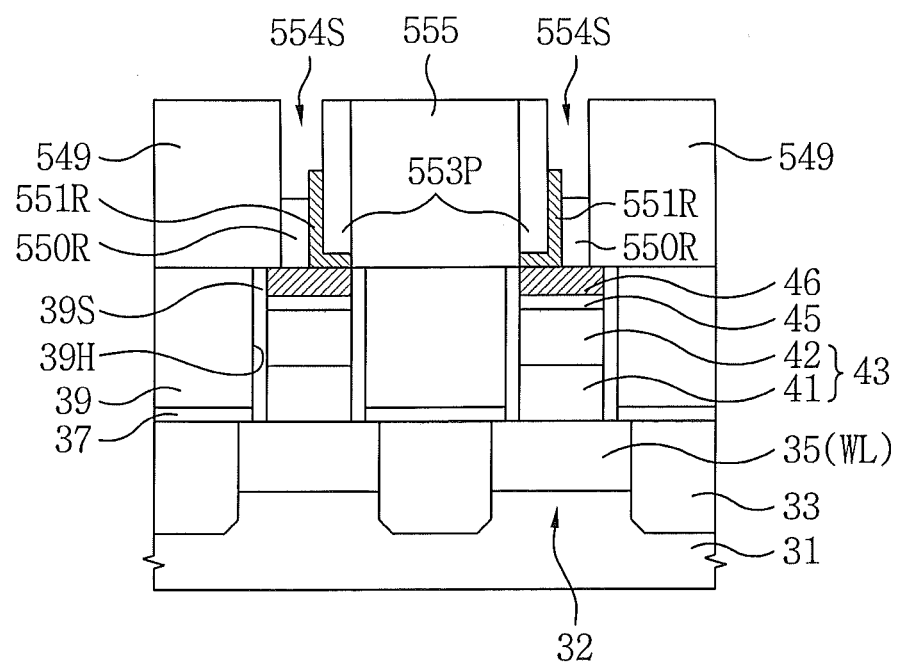
Figure 39D:
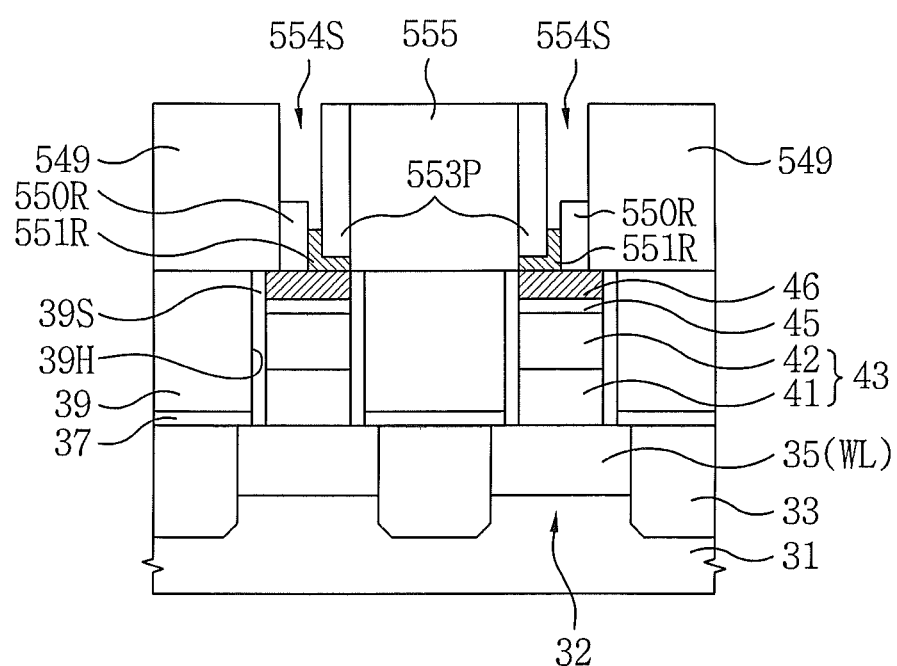
Figure 40:
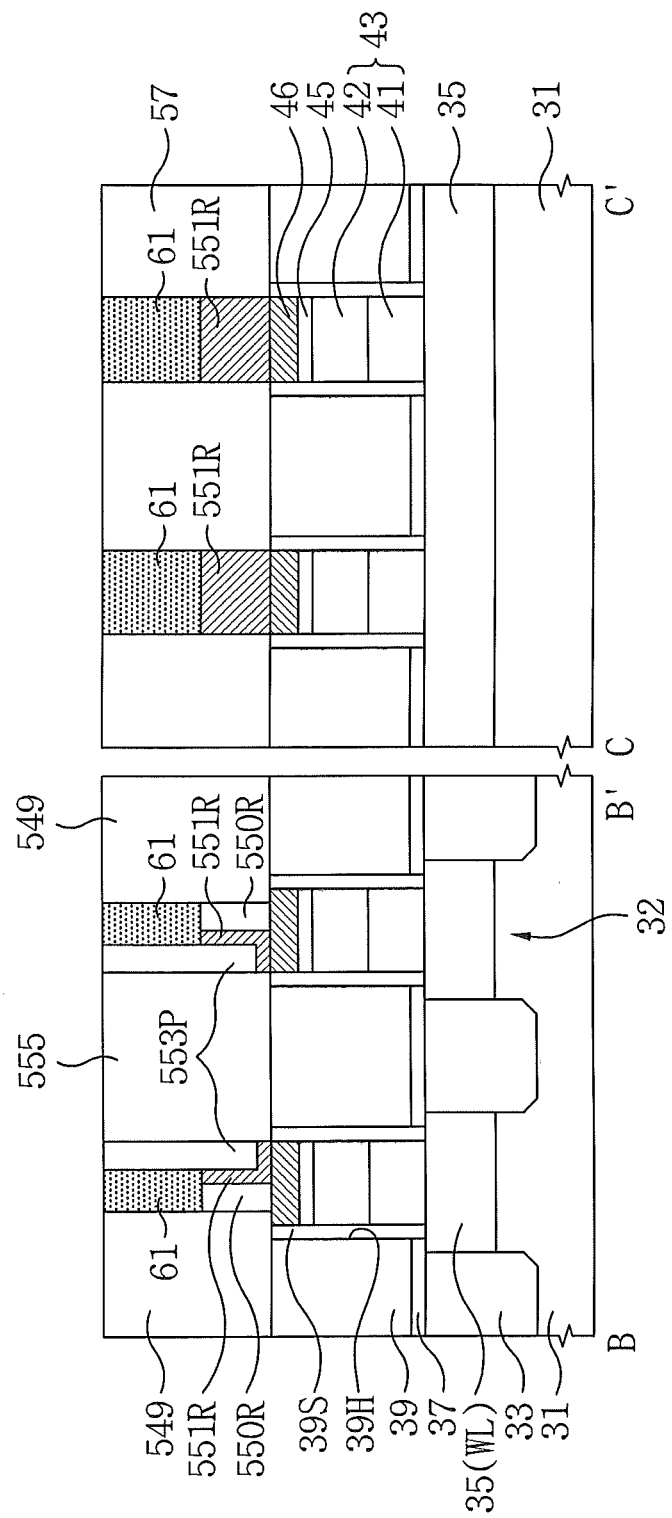
Figure 41A:
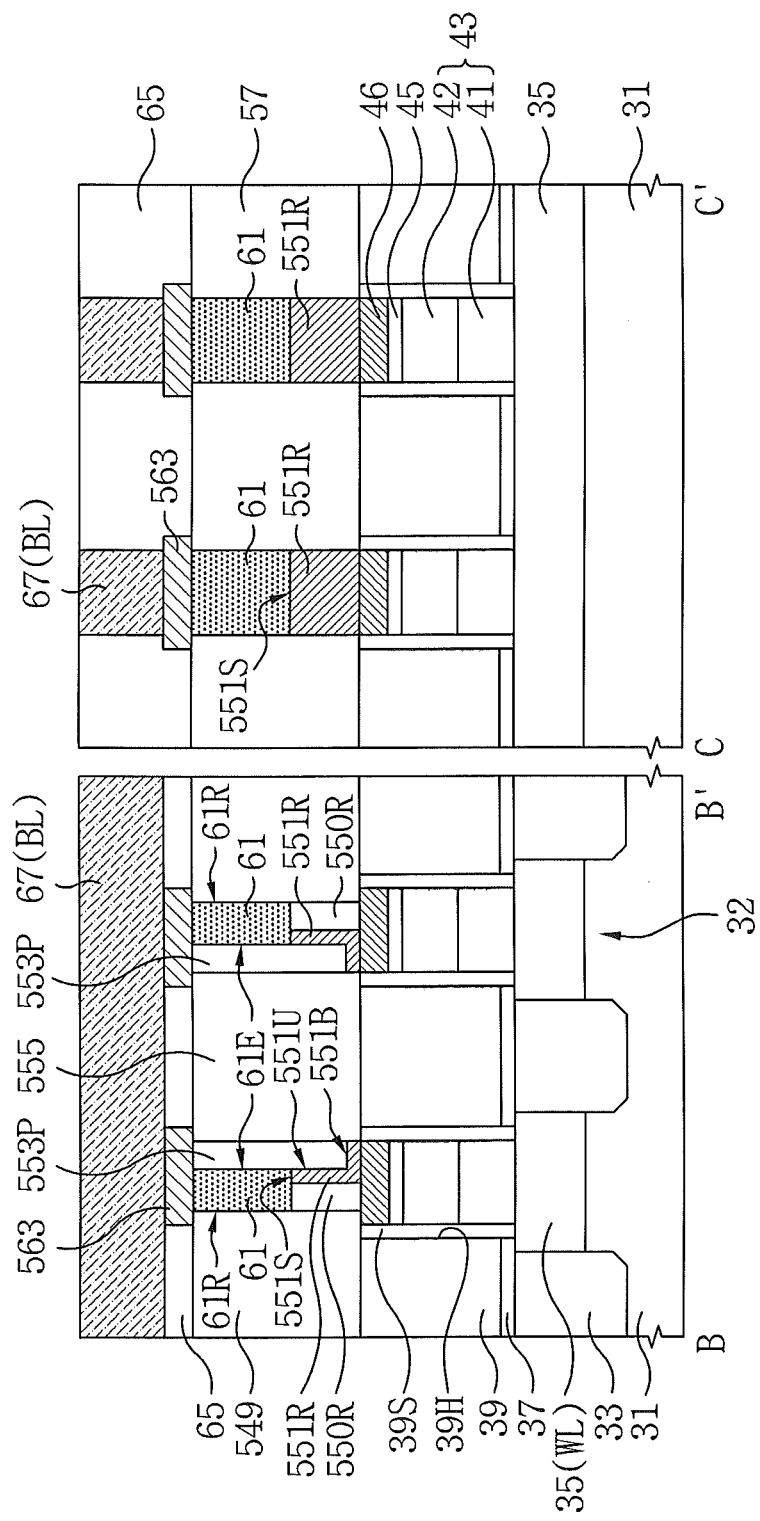
Figure 41B:
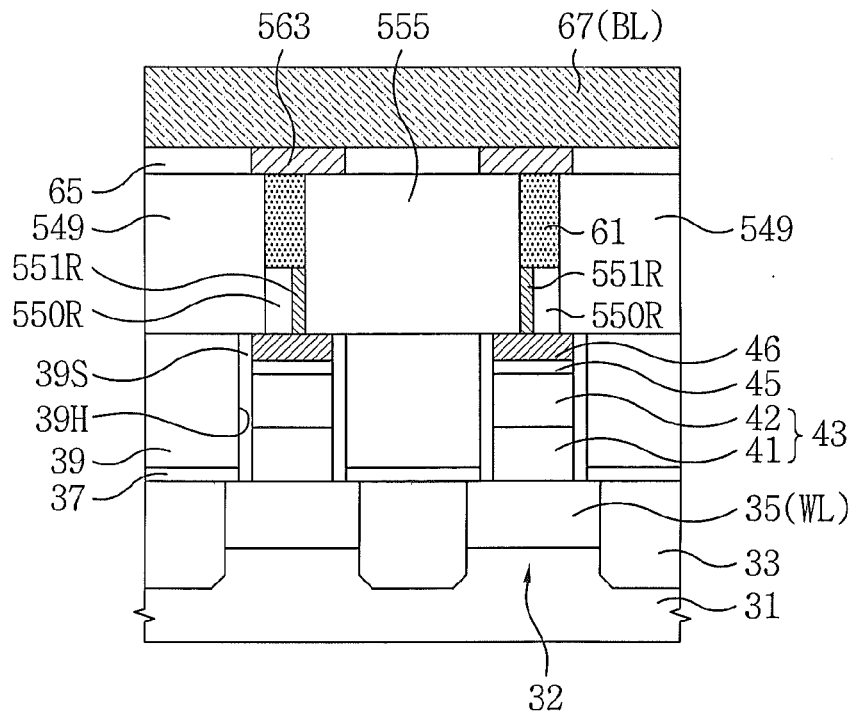
Figure 41C:
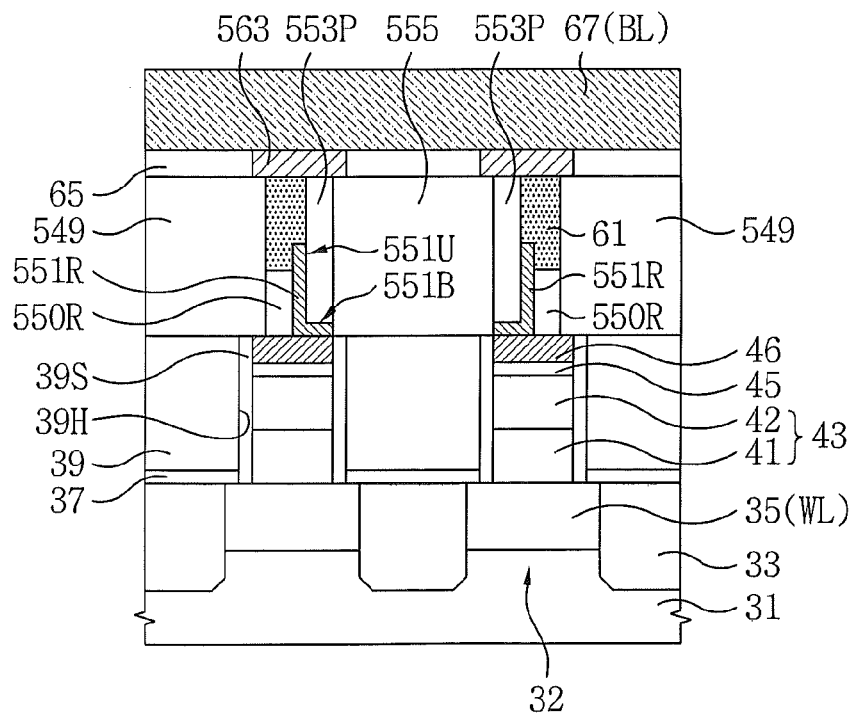
Figure 41D:
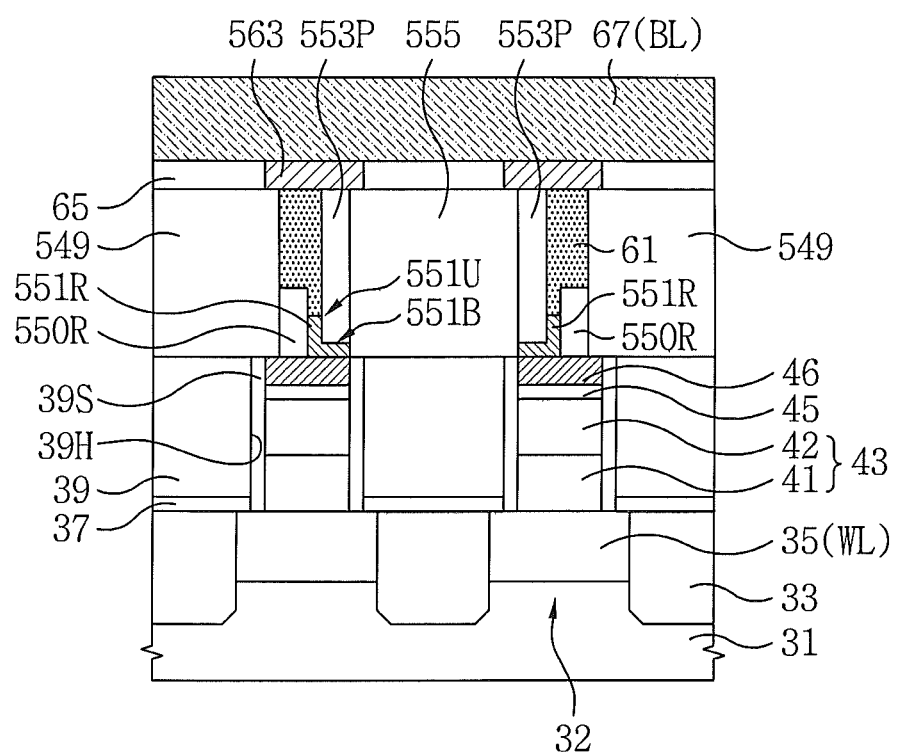

FIG. 33 is a layout diagram of a semiconductor device according to a sixth embodiment of the inventive concept, and FIGS. 34 to 41D are cross-sectional views illustrating a method of fabricating a semiconductor device according to a sixth embodiment of the inventive concept. In FIGS. 34 and 41D, lines B-B' and C-C' represent lines taken along lines B-B' and C-C' of FIG. 33.

Referring to FIGS. 33 and 34, an isolation layer 33 defining active regions 32 may be formed in a predetermined region of a semiconductor substrate 31. Word lines (WL) 35 may be formed in the active regions 32. An etch stop layer 37 and a lower insulating layer 39 may be sequentially formed on the WLs 35. Diode holes 39H penetrating the lower insulating layer 39 and the etch stop layer 37 to expose the WLs 35 may be formed. Contact spacers 39S may be formed on sidewalls of the diode holes 39H. A first semiconductor pattern 41 and a second semiconductor pattern 42 may be sequentially formed in each of the diode holes 39H. The first semiconductor pattern 41 and the second semiconductor pattern 42 may constitute a diode 43. A metal silicide pattern 45 and a diode electrode 46 may be sequentially stacked on the diode 43. Then, a first insulating pattern 549 having a first opening 549G may be formed on the semiconductor substrate 31.

The first insulating pattern 549 may be formed using a thin film formation process and a patterning process. The first opening 549G may be a groove or a trench. For example, the first opening 549G may be formed between the WLs 35. A top surface of the diode electrode 46 may be partially exposed on a bottom of the first opening 549G. That is, the first insulating pattern 549 may partially cover a top surface of the diode electrode 46. In this case, sidewalls of the first insulating pattern 549 may be formed to cross over the top surface of the diode electrode 46.

Figure 35:
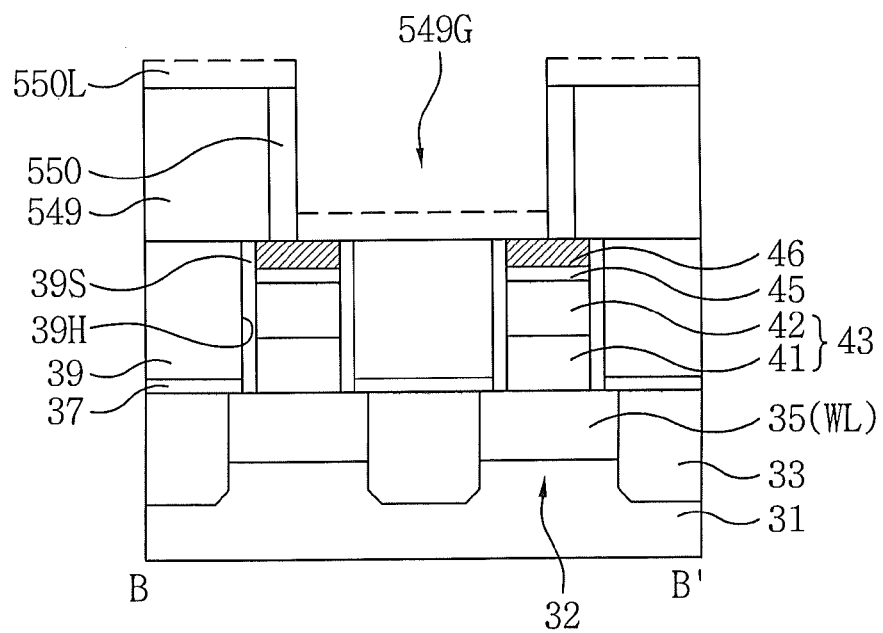

Referring to FIGS. 33 and 35, a first spacer layer 550L conformally covering a surface of the semiconductor substrate 31 having the first insulating pattern 549 may be formed. The first spacer layer 550L may be partially removed to form a first spacer 550 covering the sidewall of the first insulating pattern 549. That is, the first spacer 550 may cover a sidewall of the first opening 549G, and the first spacer 550 may be in contact with the diode electrode 46. The first spacer layer 550L may be partially removed using an anisotropic etching process. The first spacer 550 may be referred to as a resistive pattern or a sacrificial spacer. As a result, the top surface of the diode electrode 46 may be partially exposed on the bottom of the first opening 549G.

Figure 36A:
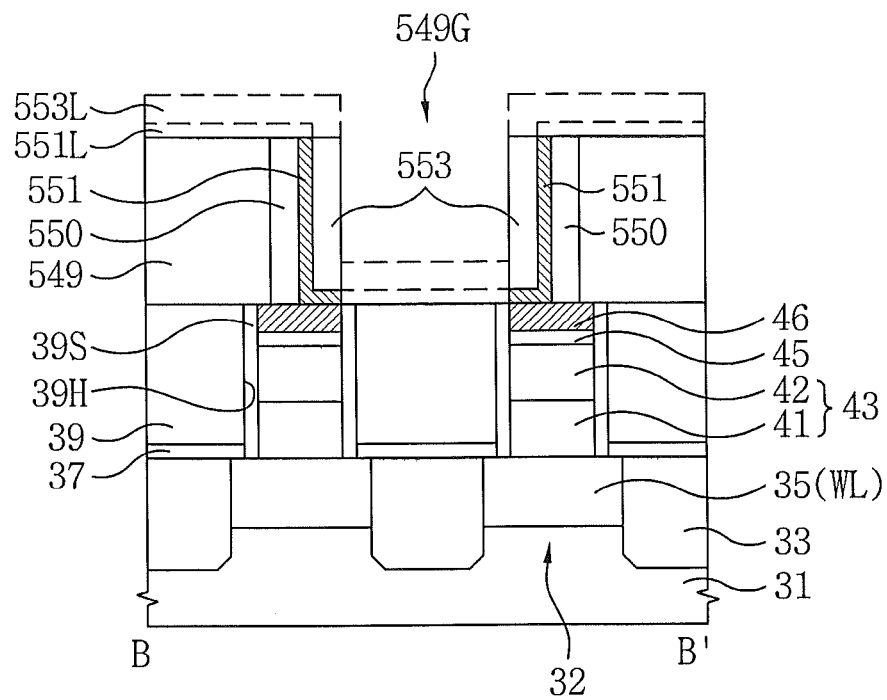

Referring to FIGS. 33 and 36A, a bottom electrode layer 551L conformally covering the surface of the semiconductor substrate 31 having the first spacer 550 may be formed. A second spacer layer 553L conformally covering a surface of the bottom electrode layer 551L may be formed. The bottom electrode layer 551L and the second spacer layer 553L may cover the sidewall of the first opening 549G. The bottom electrode layer 551L may be formed of a material selected from the group consisting of a TiN layer, a TiAlN layer, a TiCN layer, a TiSiN layer, a TiON layer, a TaN layer, a TaAlN layer, a TaCN layer, a TaSiN layer, a C layer, a CN layer, a CoSi layer, a WN layer, a WSi layer and combinations thereof.

The second spacer layer 553L and the bottom electrode layer 551L may be partially removed to form a second spacer 553 and a bottom electrode 551. The second spacer layer 553L may be partially removed using an anisotropic etching process. The bottom electrode layer 551L may be partially removed using an anisotropic etching process, an isotropic etching process, or combinations thereof. The bottom electrode 551 may be in contact with the top surface of the diode electrode 46. The second spacer 553 may be in contact with the bottom electrode 551. In this case, the bottom electrode 551 may be elongated between the diode electrode 46 and the second spacer 553. That is, viewed from a longitudinal cross-sectional view, the bottom electrode 551 may be in the shape of an "L." The second spacer 553 may be a resistive pattern.

Figure 36B:
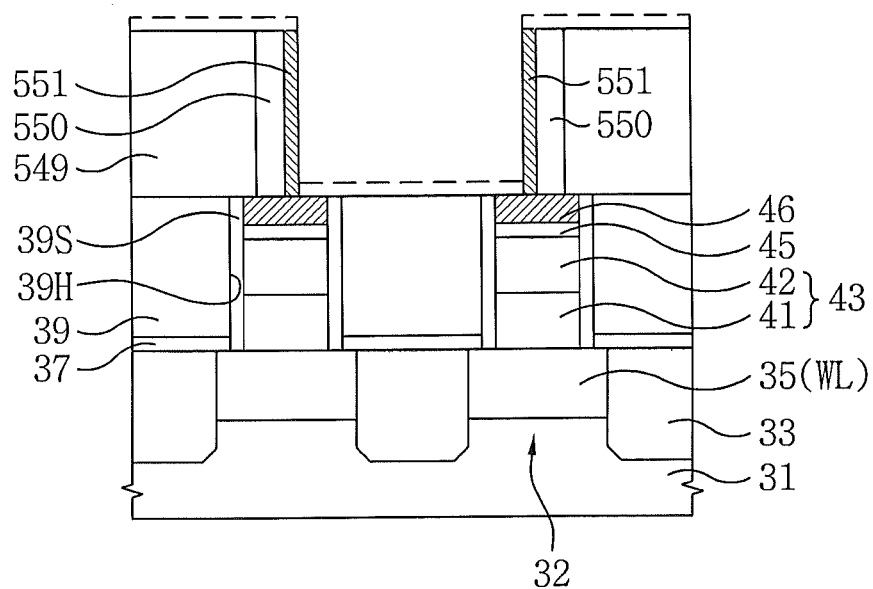

Referring to FIGS. 36A and 36B, a process of forming the second spacer layer 553L and the second spacer 553 may be omitted in some embodiments. In this case, a sidewall of the bottom electrode 551 may be in contact with the first spacer 550, and a bottom of the bottom electrode 551 may be in contact with the diode electrode 46.

Figure 37A:
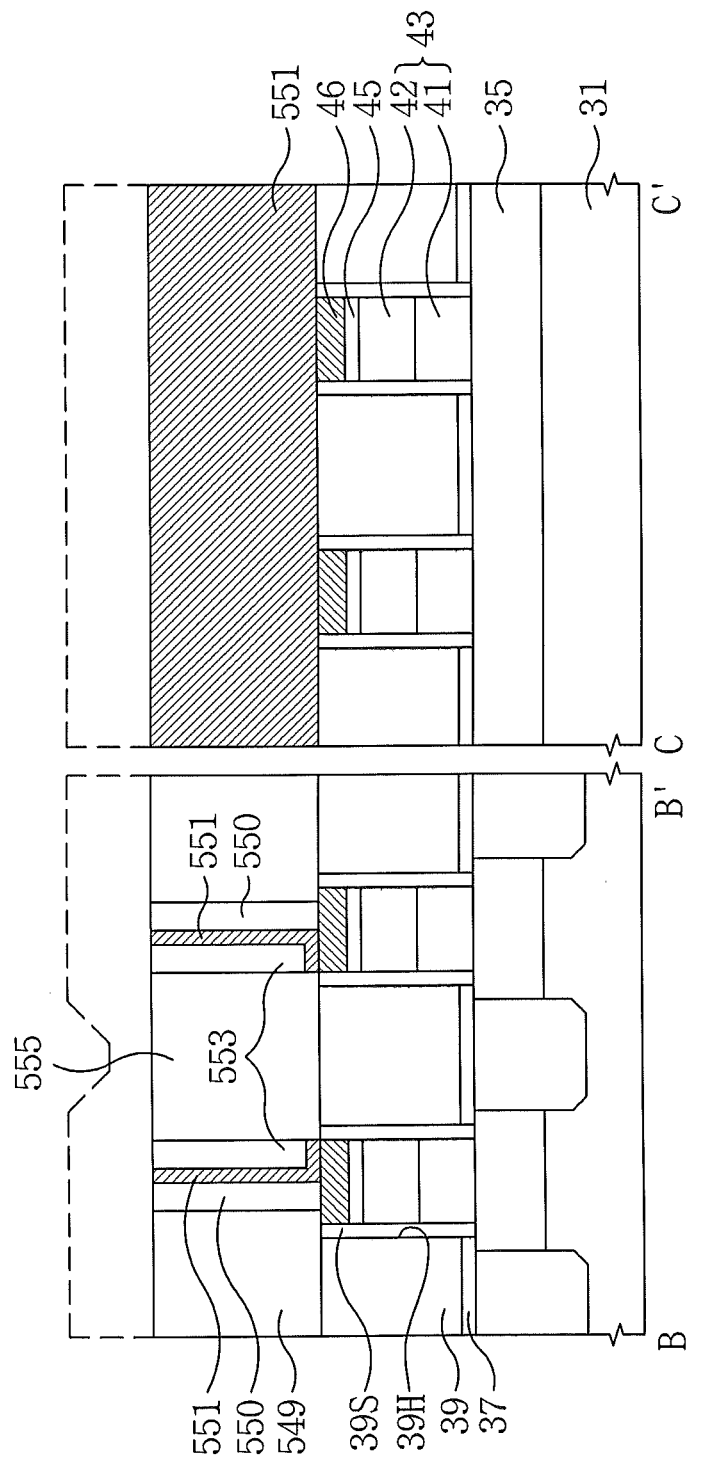

Referring to FIGS. 33 and 37A, a second insulating pattern 555 filling the first opening 549G may be formed. The second insulating pattern 555 may be formed using a thin film formation process and a planarization process. The second insulating pattern 555 may be in contact with a sidewall of the second spacer 553.

The second spacer 553, the first insulating pattern 549 and the second insulating pattern 555 may be formed of a silicon oxide layer, a silicon nitride layer or a silicon oxynitride layer. The second spacer 553 and the second insulating pattern 555 may be formed of the same material layer. The first spacer 550 may be formed of a material layer having an etch selectivity of 3:1 or greater with respect to the second spacer 553, the first insulating pattern 549 and the second insulating pattern 555, and having a higher electrical resistance than the bottom electrode 551. The first spacer 550 may be formed of a Si layer, a SiO layer, a SiN layer, a SiON layer, a carbon (C) layer, a SiC layer, a CN layer, a HfO layer, and/or a TiO layer. For example, the second spacer 553, the first insulating pattern 549, and the second insulating pattern 555 may be formed of a SiN layer, and the first spacer 550 may be formed of a Si layer and/or a SiO layer. In other embodiments, the first insulating pattern 549 may be formed of a high density plasma oxide layer, and the first spacer 550 may be formed of an atomic layer deposition oxide and/or low pressure-tetra ethyl ortho silicate (LP-TEOS) layer. In still other embodiments, the first spacer 550 may be formed of a polysilicon layer. In yet other embodiments, the second spacer 553, the first insulating pattern 549, and the second insulating pattern 555 may be formed of different material layers.

Figure 37B:
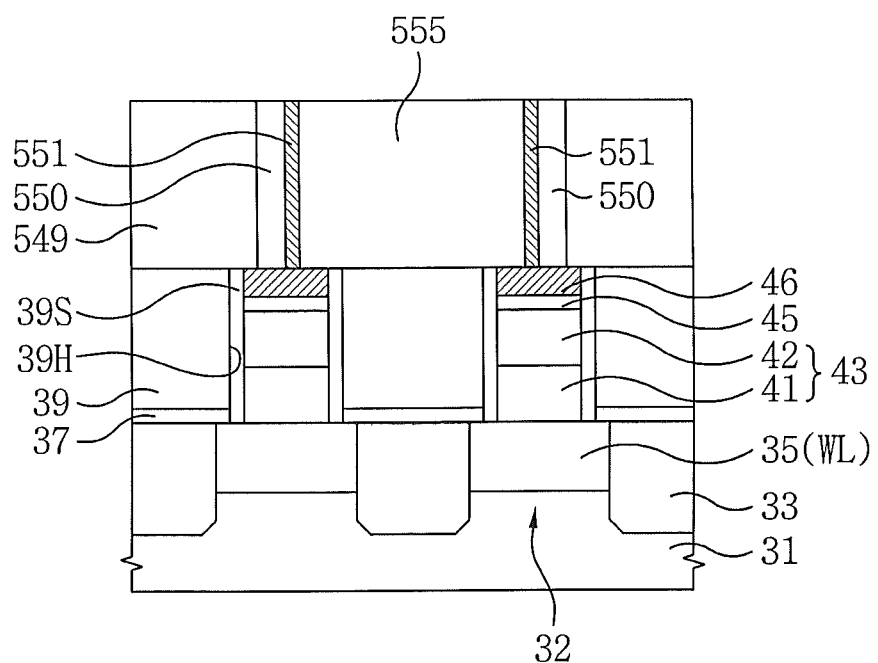

Referring to FIGS. 37A and 37B, when the second spacer 553 is omitted, the second insulating pattern 555 may be in contact with a sidewall of the bottom electrode 551.

Figure 38:
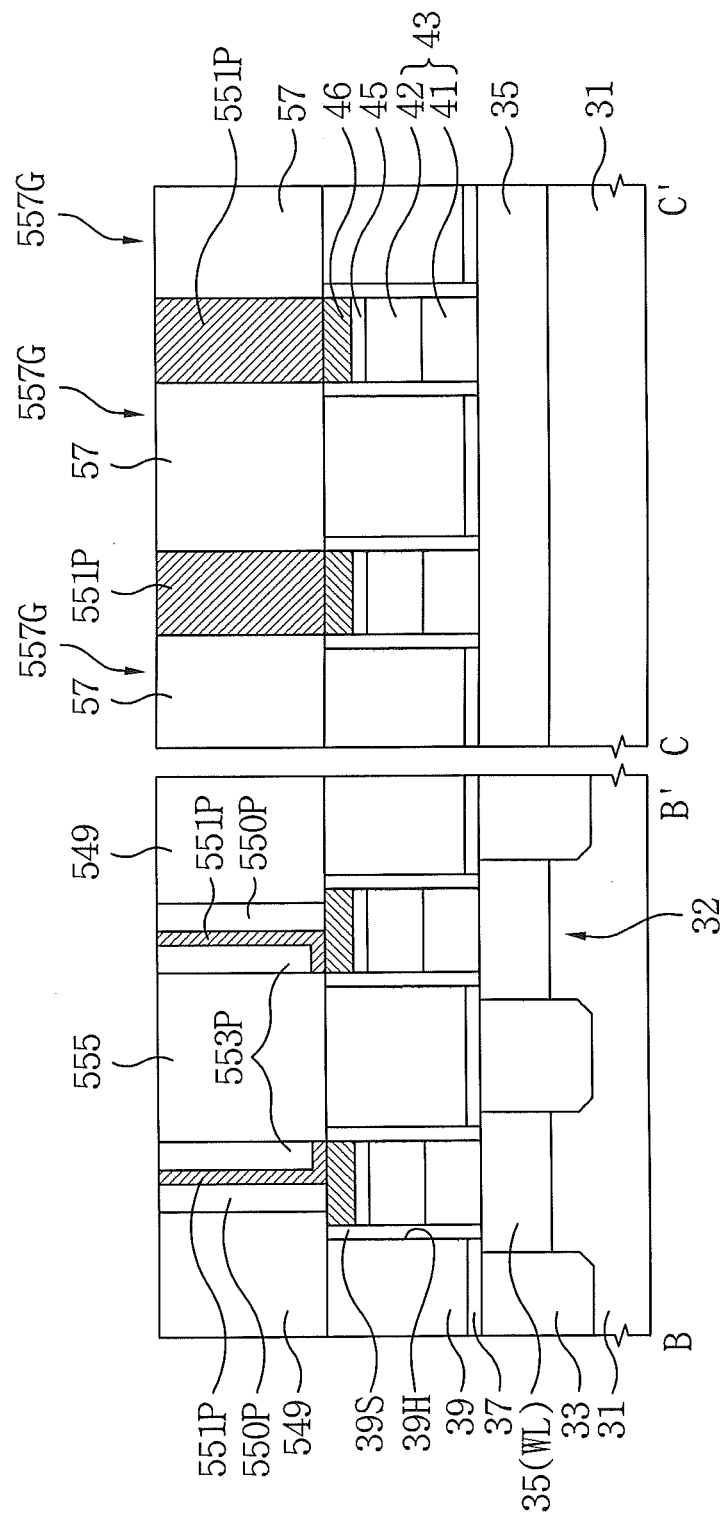

Referring to FIGS. 33 and 38, the first insulating pattern 549, the first spacer 550, the bottom electrode 551, the second spacer 553, and the second insulating pattern 555 may be patterned to form a second opening 557G. The second opening 557G may be a groove. As a result, the bottom electrode 551 may be divided into a plurality of patterned bottom electrodes 551P, the first spacer 550 may be divided into a plurality of patterned first spacers 550P, and the second spacer 553 may be divided into a plurality of patterned second spacers 553P. The patterned bottom electrodes 551P may be in contact with the diode electrode 46.

A third insulating pattern 57 filling the second opening 557G may be formed. The third insulating pattern 57 may be in the shape of a bar crossing over the WL 35. The third insulating pattern 57 may be formed using a thin film formation process and a planarization process. The planarization process may include a chemical mechanical polishing (CMP) method and/or an etch-back method. The third insulating pattern 57 may be formed of the same material layer as the second insulating pattern 555. The third insulating pattern 57 may be formed of a silicon oxide layer, a silicon nitride layer, and/or a silicon oxynitride layer.

Referring to FIGS. 33 and 39A, the patterned first spacer 550P and the patterned bottom electrode 551P may be partially removed, so that a slit 554S may be formed between the first insulating pattern 549 and the patterned second spacer 553P. A recessed first spacer 550R and a recessed bottom electrode 551R may remain below the slit 554S. The recessed bottom electrode 551R and the recessed first spacer 550R may constitute a bottom electrode structure. The slit 554S may be self-aligned with the bottom electrode structure. The slit 554S may be formed to have a greater width than the recessed bottom electrode 551R. In some embodiments, the slit 554S may be referred to as an opening, a trench or a contact hole.

The recessed bottom electrode 551R and the recessed first spacer 550R may be formed at a lower level than top surfaces of the first insulating pattern 549 and the patterned second spacer 553P. The patterned second spacer 553P may remain on a sidewall of the second insulating pattern 555. In this case, the recessed bottom electrode 551R and the recessed first spacer 550R may be formed at a lower level than top surfaces of the first insulating pattern 549 and the second insulating pattern 555.

The partial removal of the patterned first spacer 550P and the partial removal of the patterned bottom electrode 551P may be sequentially performed. For example, the partial removal of the patterned first spacer 550P and the patterned bottom electrode 551P may be performed using a dry etching process or a wet etching process. In other embodiments, the partial removal of the patterned first spacer 550P and the partial removal of the patterned bottom electrode 551P may be alternately and repeatedly performed several times.

While the etching processes are performed, the patterned bottom electrode 551P may be in uniform contact with an etching solution and/or etching gas through the slit 554S. Accordingly, a top surface 551S of the recessed bottom electrode 551R may exhibit a generally uniform surface level. The plurality of recessed bottom electrodes 551R two-dimensionally aligned in columns and rows may be provided on the semiconductor substrate 31. In this case, the top surfaces 551S of the recessed bottom electrode 551R may be in a generally uniform shape on the entire surface of the semiconductor substrate 31.

Referring to FIG. 39B, when the second spacer 553 is omitted, a slit 554S may be formed between the first insulating pattern 549 and the second insulating pattern 555. A recessed first spacer 550R and a recessed bottom electrode 551R may remain below the slit 554S. The recessed bottom electrode 551R and the recessed first spacer 550R may be formed at a lower level than top surfaces of the first insulating pattern 549 and the second insulating pattern 555.

Referring to FIG. 39C, the recessed bottom electrode 551R may protrude to have a higher level than the recessed first spacer 550R.

Referring to FIG. 39D, the recessed first spacer 550R may protrude to have a higher level than the recessed bottom electrode 551R.

Referring to FIGS. 33 and 40, a data storage plug 61 filling the slit 554S may be formed. The data storage plug 61 may be in contact with the recessed bottom electrode 551R. Forming the data storage plug 61 may include a data storage material layer formation process and a planarization process. The planarization process may include a chemical mechanical polishing (CMP) method and/or an etching-back method.

The data storage plug 61, in accordance with various embodiments, may be formed as a phase-change plug, a polymer plug, a nanoparticle plug and/or a resistance-change plug. For example, the resistance-change plug may include a SrTiO$_3$ layer. Also, when the data storage plug 61 is formed as a phase-change plug, the phase-change plug may be formed of a material selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, InSe layer, a GaTeSe layer, and a InSbTe layer. Furthermore, the phase-change plug may be formed of a material layer including a material selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, a InSe layer, a GaTeSe layer, and a InSbTe layer, and a material selected from the group consisting of C, N, Si, O, and N.

Referring to FIGS. 33 and 41A, an upper electrode 563 may be formed on the data storage plug 61. An upper insulating layer 65 covering the upper electrode 563 may be formed. Bit lines (BL) 67 may be formed in the upper insulating layer 65. Each of the BLs 67 may be electrically connected to the data storage plug 61 through the upper electrode 563. In some embodiments, when the upper electrode 563 is omitted, the BLs 67 may be in direct contact with the data storage plug 61.

The upper electrode 563 may be formed of a material selected from the group consisting of a W layer, a WN layer, a WSi layer, a Ti layer, a TiN layer, a TiAlN layer, a TiCN layer, a TiSiN layer, a TiON layer, a Ta layer, a TaN layer, a TaAlN layer, a TaCN layer, a TaSiN layer, a C layer, a CN layer, a CoSi layer and combinations thereof. The upper insulating layer 65 may be formed of a silicon oxide layer, a silicon nitride layer or a silicon oxynitride layer. The BLs 67 may be formed of a material selected from the group consisting of a W layer, a WN layer, a WSi layer, a Ti layer, a TiN layer, a TiAlN layer, a TiCN layer, a TiSiN layer, a TiON layer, a Ta layer, a TaN layer, a TaAlN layer, a TaCN layer, a TaSiN layer, a C layer, a CN layer, a CoSi layer, an Al layer, a Cu layer and combinations thereof.

The data storage plug 61 may include a first sidewall 61E aligned with a sidewall of the recessed bottom electrode 551R and a second sidewall 61R aligned with a sidewall of the recessed first spacer 550R. The data storage plug 61 may be self-aligned with the recessed bottom electrode 551R and the recessed first spacer 550R.

The recessed bottom electrode 551R may include an upper part 551U and a lower part 551B so as to have a cross-sectional view in the shape of an "L." The upper part 551U may have a longer vertical length than a horizontal length. The lower part 551B may have a longer horizontal length than a vertical length. The patterned second spacer 553P may be formed on a sidewall of the upper part 551U and the lower part 551B.

As described above, the recessed bottom electrode 551R may include a top surface 551S that has a generally uniform surface level. Accordingly, a contact area between the data storage plug 61 and the recessed bottom electrode 551R may be relatively reduced. Also, the contact area between the data storage plug 61 and the recessed bottom electrode 551R may have a generally uniform distribution on the entire surface of the semiconductor substrate 31.

Referring to FIG. 41B, the data storage plug 61 may be formed between the first insulating pattern 549 and the second insulating pattern 555. The data storage plug 61 may be in contact with the recessed bottom electrode 551R and the recessed first spacer 550R.

Referring to FIG. 41C, when the recessed bottom electrode 551R protrudes to have a higher level than the recessed first spacer 550R, the data storage plug 61 may be in contact with a top surface and sidewall of the recessed bottom electrode 551R.

Referring to FIG. 41D, when the recessed first spacer 550R protrudes to have a higher level than the recessed bottom electrode 551R, the data storage plug 61 may be in contact with a top surface and sidewall of the recessed first spacer 550R. In this case, the data storage plug 61 may be elongated between the recessed first spacer 550R and the patterned second spacer 553P. A contact area between the data storage plug 61 and the recessed bottom electrode 551R may be relatively reduced.

SEVENTH EMBODIMENT

Figure 42:
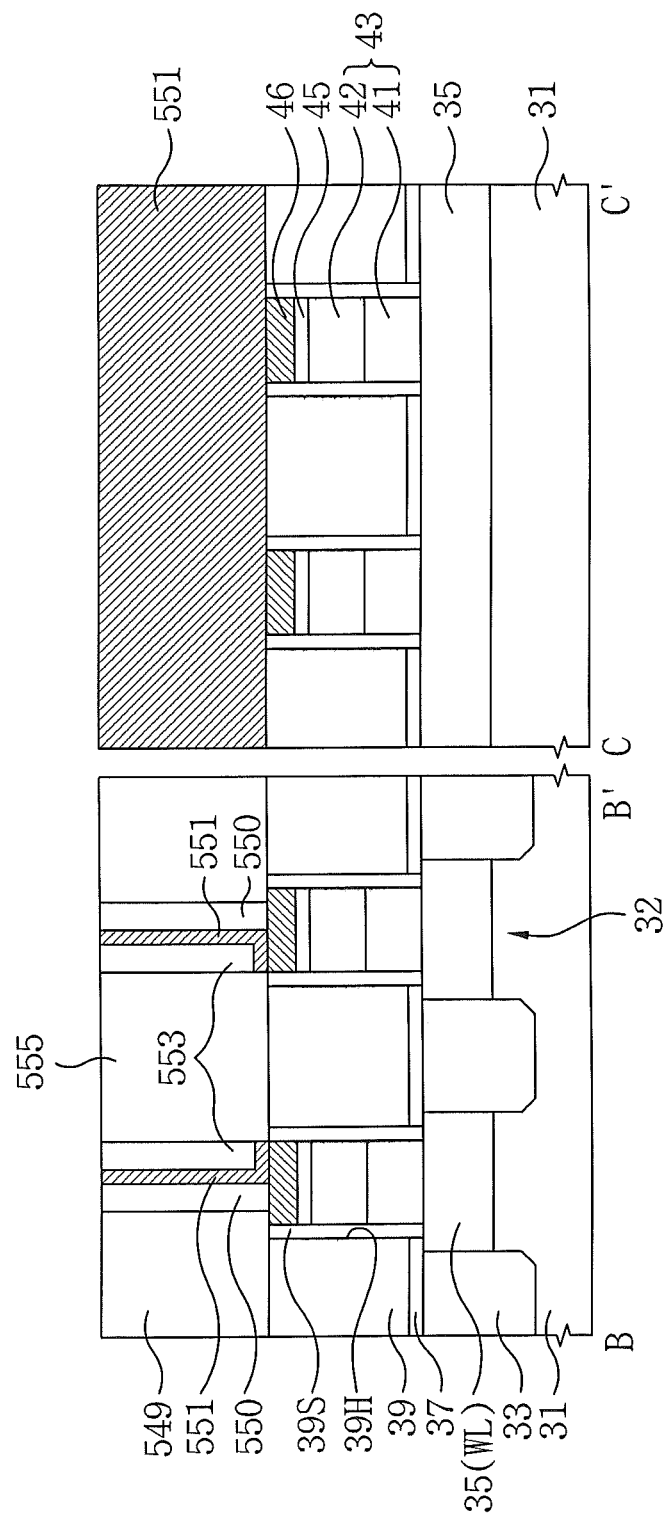
FIGS. 42 to 44 are cross-sectional views illustrating a method of fabricating a semiconductor device according to a seventh embodiment of the inventive concept.
Figure 43:
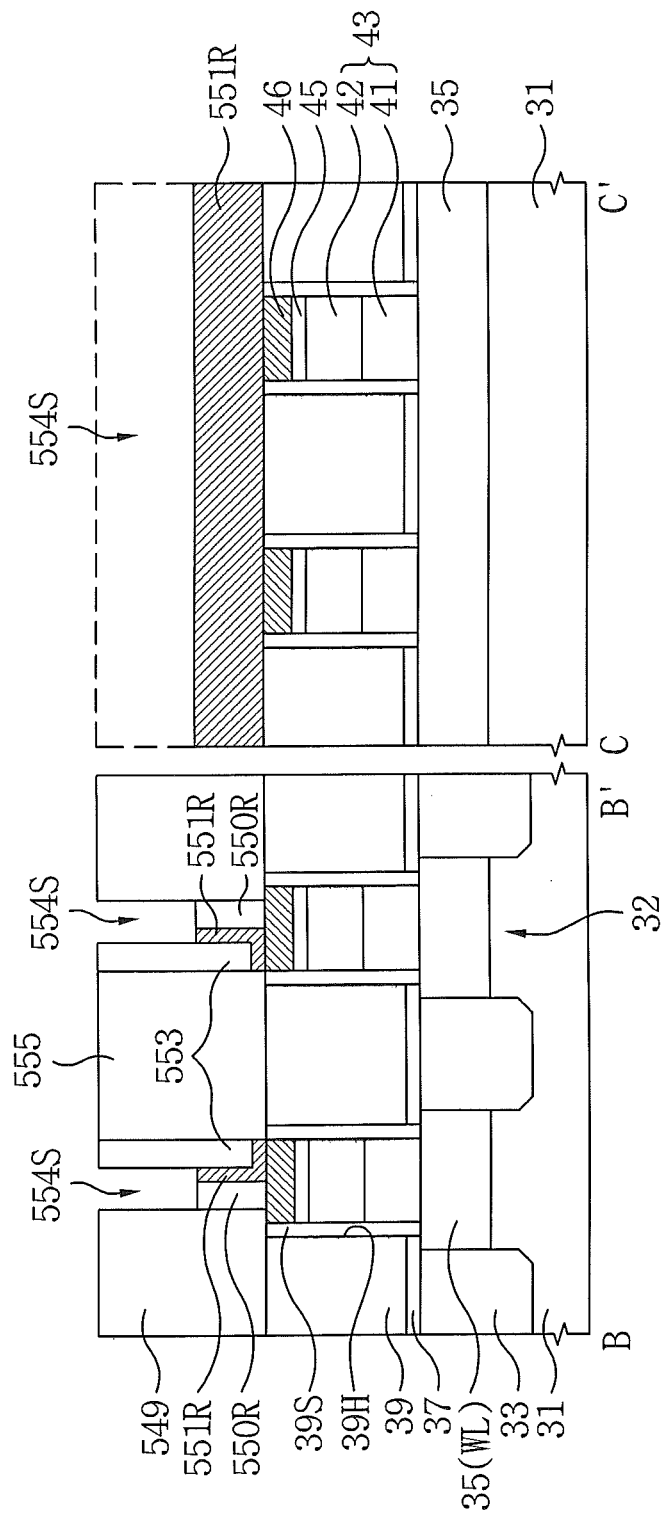
Figure 44:
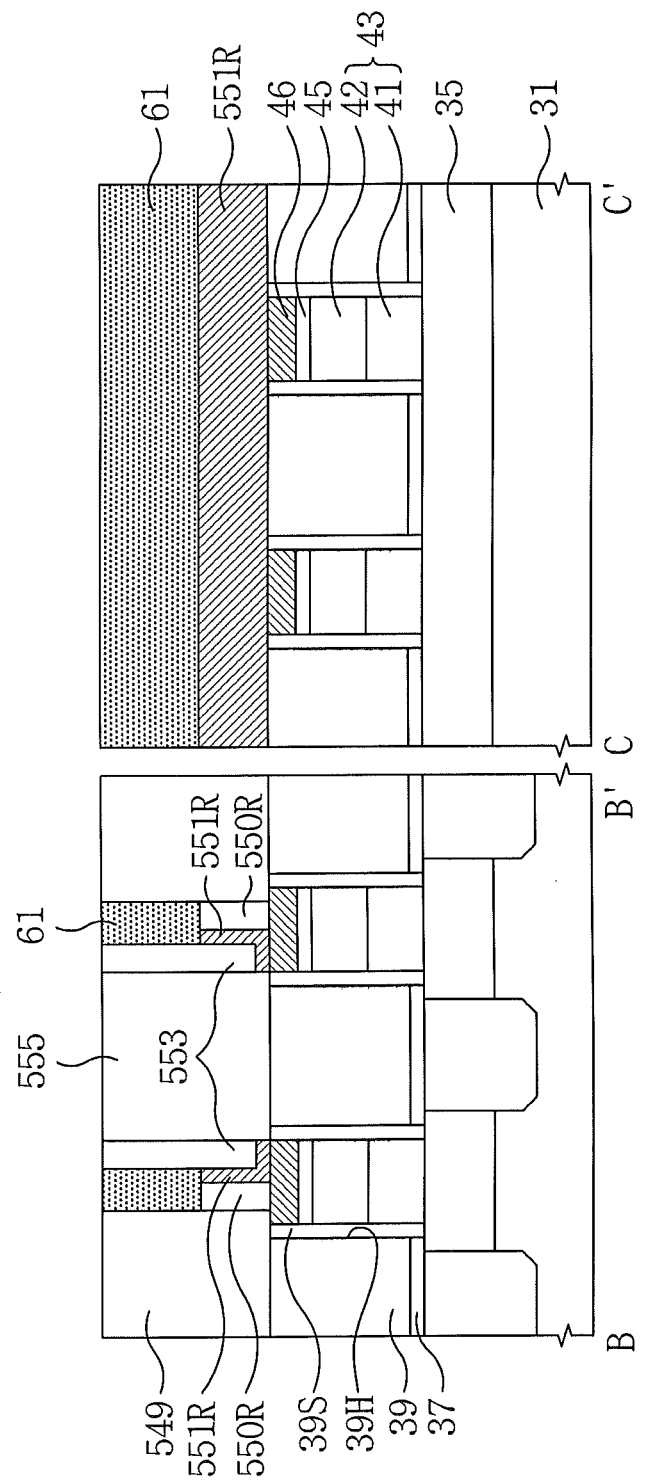

FIGS. 42 to 44 are cross-sectional views illustrating a method of fabricating a semiconductor device according to a seventh embodiment of the inventive concept. In FIGS. 42 to 44, lines B-B' and C-C' represent lines taken along lines B-B' and C-C' of FIG. 33.

Referring to FIGS. 33 and 42, an active region 32, an isolation layer 33, a WL 35, an etch stop layer 37, a lower insulating layer 39, a diode hole 39H, a contact spacer 39S, a first semiconductor pattern 41, a second semiconductor pattern 42, a diode 43, a metal silicide pattern 45, a diode electrode 46, a first insulating pattern 549, a first spacer 550, a second spacer 553, a bottom electrode 551 and a second insulating pattern 555 may be formed on a semiconductor substrate 31. Only differences will be briefly described below.

Referring to FIGS. 33 and 43, the first spacer 550 and the bottom electrode 551 may be partially removed to form a slit 554S between the first insulating pattern 549 and the second spacer 553. A recessed first spacer 550R and a recessed bottom electrode 551R may remain below the slit 554S. The second spacer 553 may remain on a sidewall of the second insulating pattern 555.

Referring to FIGS. 33 and 44, a data storage plug 61 filling the slit 554S may be formed. Subsequently, the first insulating pattern 549, the recessed first spacer 550R, the recessed bottom electrode 551R, the data storage plug 61, the second spacer 553 and the second insulating pattern 555 may be patterned to form a semiconductor device having a similar constitution to that of FIG. 40.

EIGHTH EMBODIMENT

Figure 45:
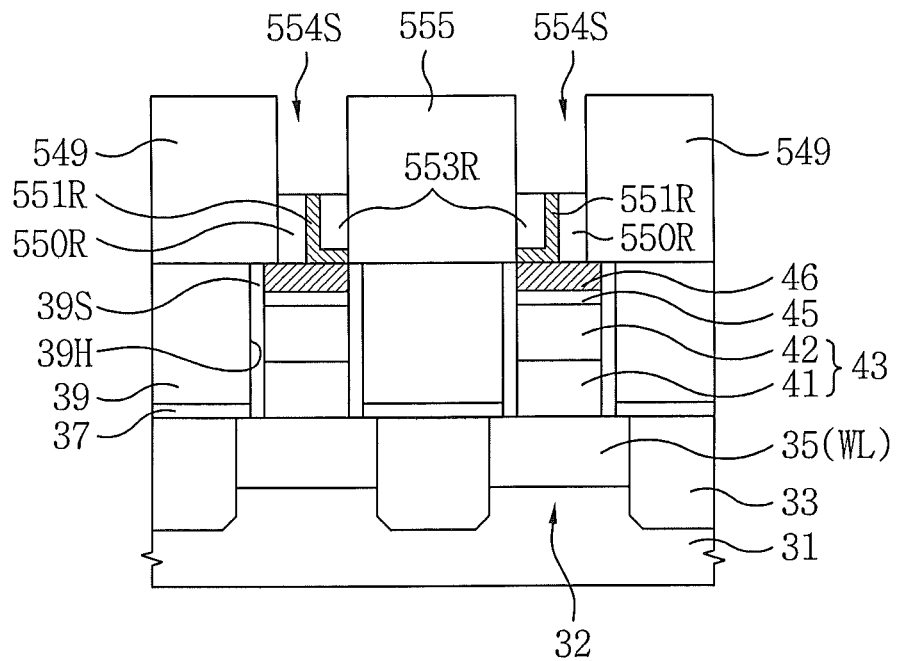
FIGS. 45 to 47 are cross-sectional views illustrating a method of fabricating a semiconductor device according to an eighth embodiment of the inventive concept.
Figure 46:
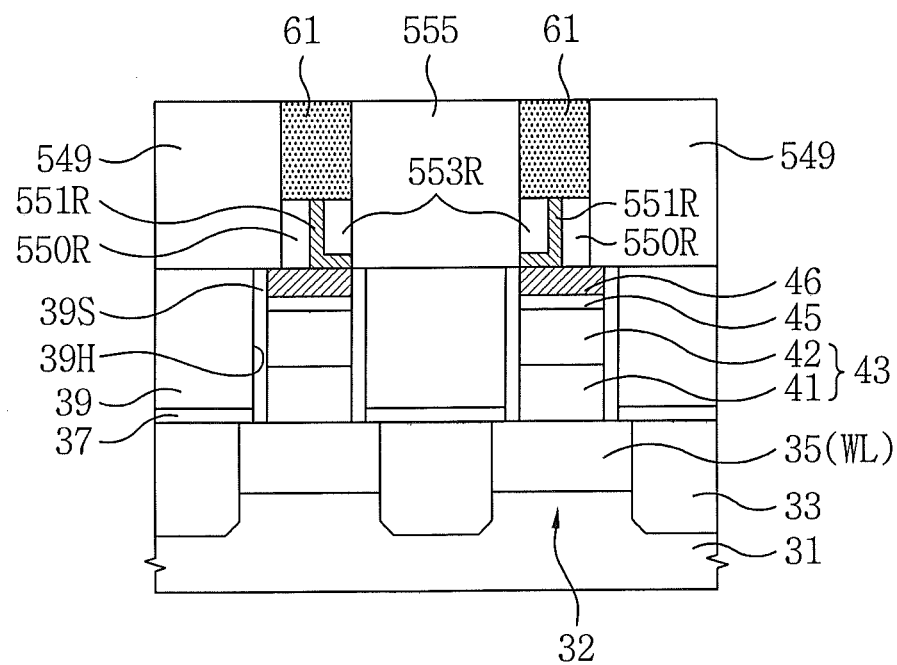
Figure 47:
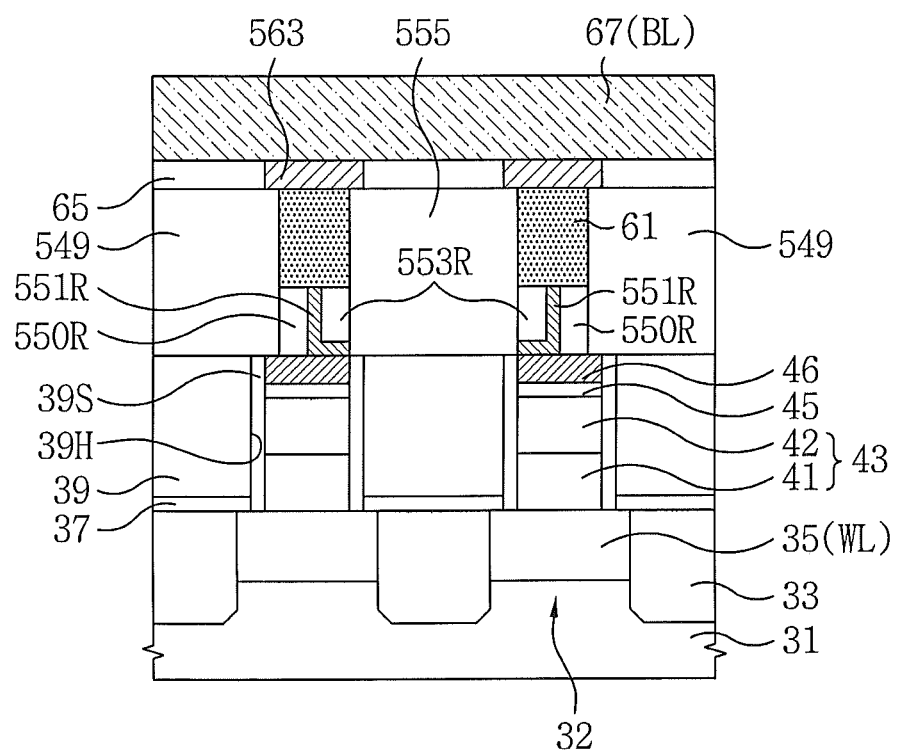

FIGS. 45 to 47 are cross-sectional views illustrating a method of fabricating a semiconductor device according to an eighth embodiment of the inventive concept.

Referring to FIG. 45, an active region 32, an isolation layer 33, a WL 35, an etch stop layer 37, a lower insulating layer 39, a diode hole 39H, a contact spacer 39S, a first semiconductor pattern 41, a second semiconductor pattern 42, a diode 43, a metal silicide pattern 45, a diode electrode 46, a first insulating pattern 549, a recessed first spacer 550R, a recessed second spacer 553R, a recessed bottom electrode 551R, a slit 554S, and a second insulating pattern 555 may be formed on a semiconductor substrate 31. Only differences will be briefly described below.

The slit 554S may be formed between the first insulating pattern 549 and the second insulating pattern 555. The recessed first spacer 550R, the recessed bottom electrode 551R, and the recessed second spacer 553R may be formed at a lower level than top surfaces of the first insulating pattern 549 and the second insulating pattern 555. The recessed first spacer 550R and the recessed second spacer 553R may be formed of a material layer having an etch selectivity with respect to the first insulating pattern 549 and the second insulating pattern 555. For example, the first insulating pattern 549 and the second insulating pattern 555 may be formed of a SiN layer, and the recessed first spacer 550R and the recessed second spacer 553R may be formed of a Si layer or a SiO layer.

Referring to FIG. 46, a data storage plug 61 filling the slit 554S may be formed. The data storage plug 61 may be self-aligned with the recessed first spacer 550R, the recessed bottom electrode 551R and the recessed second spacer 553R. The data storage plug 61 may be in contact with the recessed bottom electrode 551R.

Referring to FIG. 47, an upper electrode 563, an upper insulating layer 65, and a BL 67 may be formed on the data storage plug 61.

NINTH EMBODIMENT

FIGS. 48A to 54B are cross-sectional views illustrating a method of fabricating a semiconductor device according to a ninth embodiment of the inventive concept.

Figure 48A:
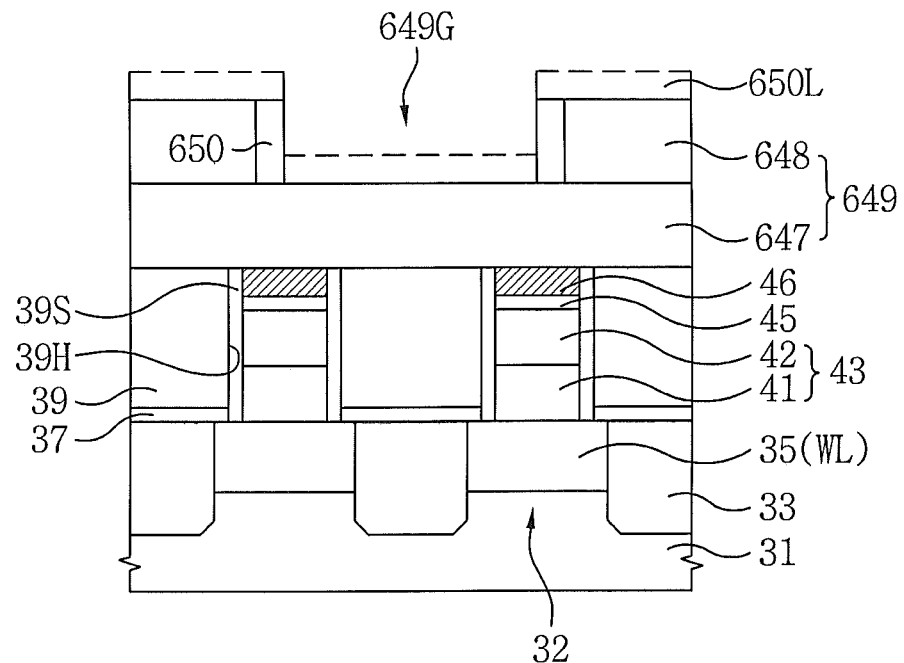
FIGS. 48A to 54B are cross-sectional views illustrating a method of fabricating a semiconductor device according to a ninth embodiment of the inventive concept.

Referring to FIG. 48A, an active region 32, an isolation layer 33, a WL 35, an etch stop layer 37, a lower insulating layer 39, a diode hole 39H, a contact spacer 39S, a first semiconductor pattern 41, a second semiconductor pattern 42, a diode 43, a metal silicide pattern 45, and a diode electrode 46 may be formed on a semiconductor substrate 31. Only differences will be briefly described below.

A first molding layer 647 and a second molding layer 648 may be sequentially formed on the lower insulating layer 39. The first molding layer 647 and the second molding layer 648 may constitute a first insulating pattern 649. The first molding layer 647 and the second molding layer 648 may be formed of different material layers.

The second molding layer 648 may be patterned to form a first opening 649G. The first molding layer 647 may be exposed on a bottom of the first opening 649G. A first spacer layer 650L may be formed on the second molding layer 648 having the first opening 649G. The first spacer layer 650L may be partially removed to form a first spacer 650 covering a sidewall of the first opening 649G. The first spacer 650 may be in contact with a sidewall of the second molding layer 648. Also, the bottom of the first spacer 650 may be in contact with the first molding layer 647. The first spacer layer 650L may be partially removed using an anisotropic etching process. The first spacer 650 may be referred to as a resistive pattern or a sacrificial spacer.

Figure 48B:
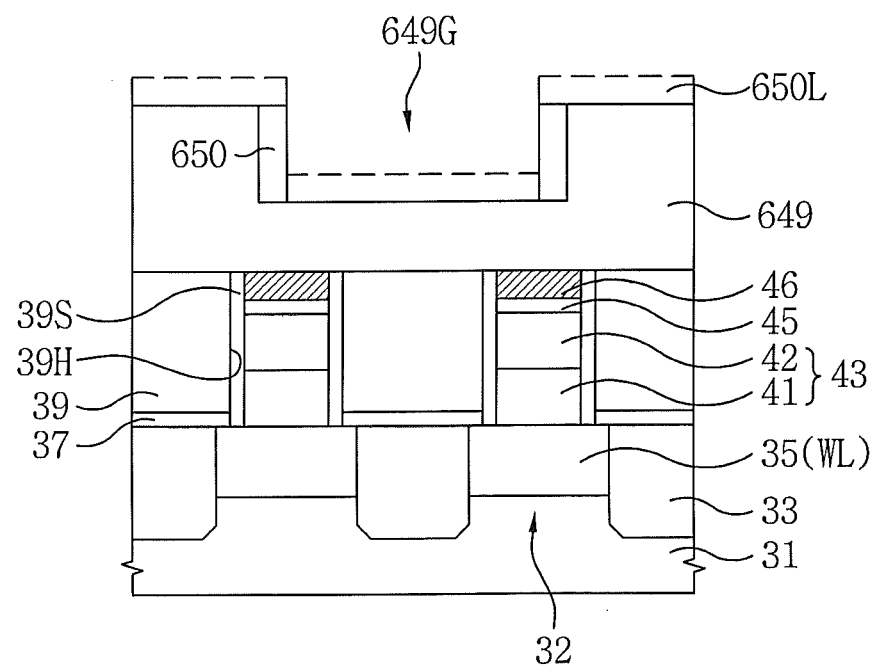

Referring to FIG. 48B, the first insulating pattern 649 may be formed of a single layer. In this case, the first insulating pattern 649 may remain below the bottom of the first opening 649G. The first spacer 650 may cover a sidewall of the first opening 649G. Further, the bottom of the first spacer 650 may be in contact with the first insulating pattern 649.

Figure 49:
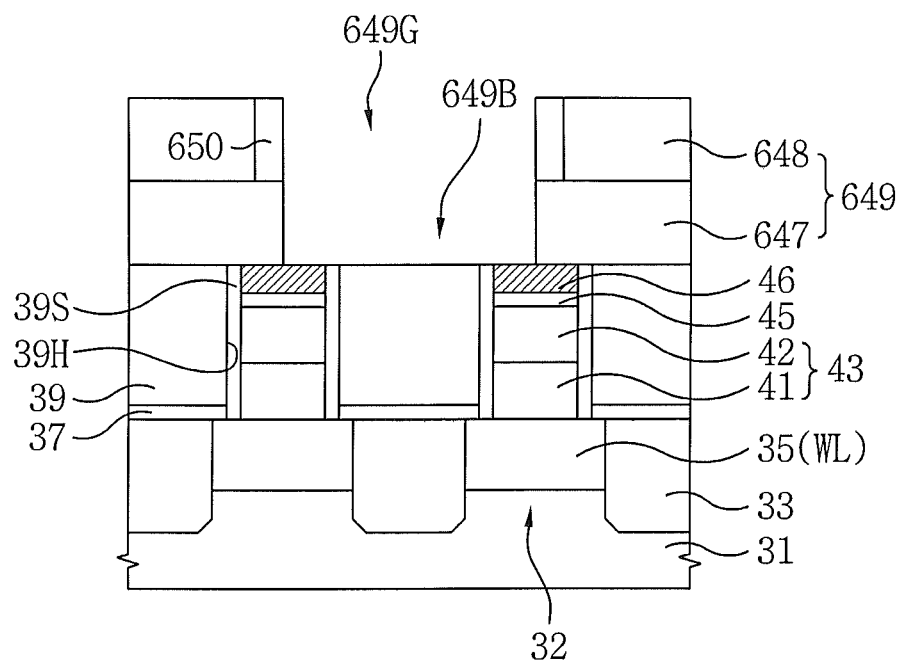

Referring to FIG. 49, the second molding layer 648 and the first spacer 650 may be used as etch masks to etch the first molding layer 647, so that a second opening 649B may be formed below the first opening 649G. A top surface of the diode electrode 46 may be partially exposed on the bottom of the second opening 649B. The first opening 649G and the second opening 649B may be a groove, a trench or a contact hole.

Figure 50:
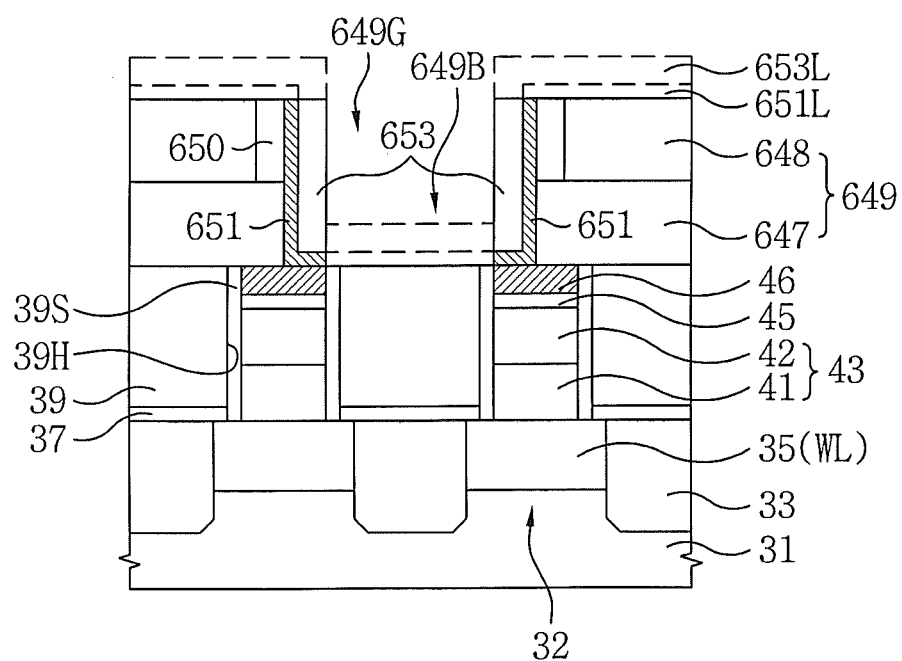

Referring to FIG. 50, a bottom electrode layer 651L conformally covering a surface of the semiconductor substrate 31 having the first spacer 650 and the second opening 649B may be formed. A second spacer layer 653L conformally covering a surface of the bottom electrode layer 651L may be formed. The second spacer layer 653L and the bottom electrode layer 651L may be partially removed to form a second spacer 653 and a bottom electrode 651. The bottom electrode 651 may be in contact with the top surface of the diode electrode 46. The second spacer 653 may be in contact with the bottom electrode 651. In this case, the bottom electrode 651 may be elongated between the diode electrode 46 and the second spacer 653.

Figure 51:
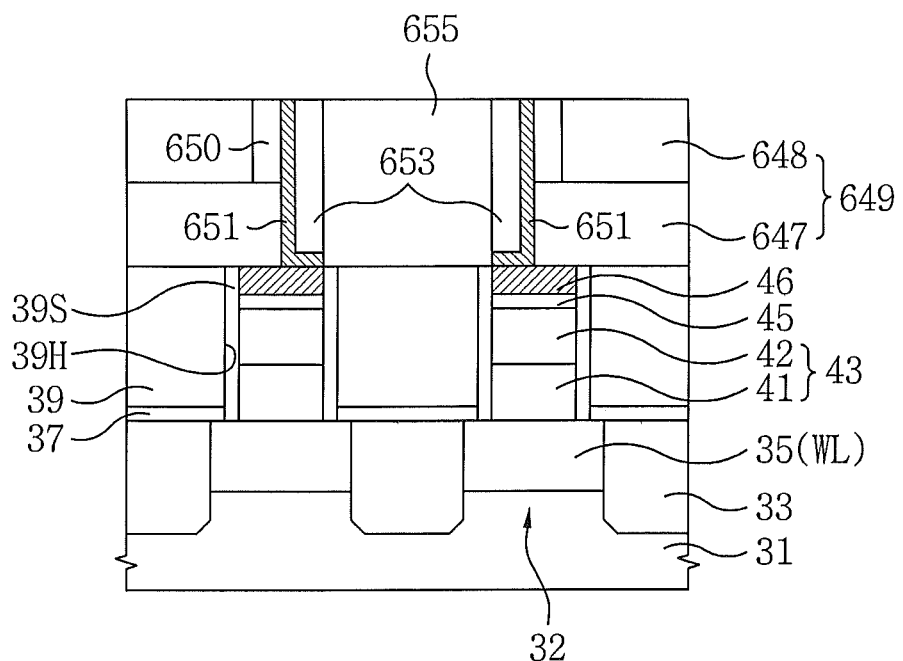

Referring to FIG. 51, a second insulating pattern 655 filling the first opening 649G and the second opening 649B may be formed. The second insulating pattern 655 may be in contact with a sidewall of the second spacer 653. The first spacer 650 may be formed of a material layer having an etch selectivity of 3:1 or greater with respect to the first insulating pattern 649, the second insulating pattern 655, and the second spacer 653. The second insulating pattern 655 and the second spacer 653 may be formed of the same material layer.

In other embodiments, the first spacer 650 and the second spacer 653 may be formed of a material layer having an etch selectivity with respect to the first insulating pattern 649 and the second insulating pattern 655. In still other embodiments, the first spacer 650 and the second spacer 653 may be formed of the same material layer.

Figure 52:
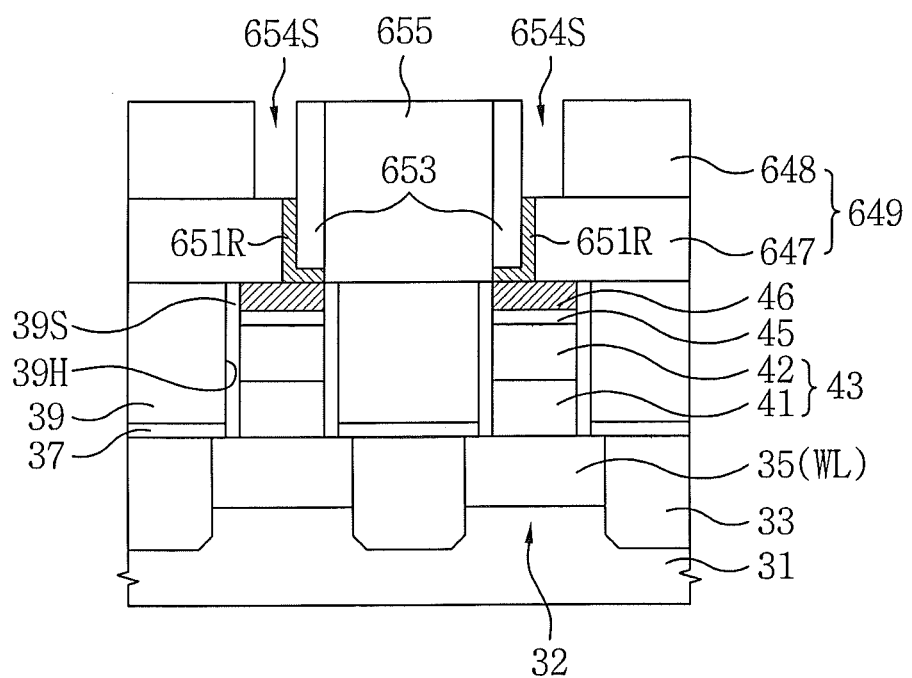

Referring to FIG. 52, the first spacer 650 and the bottom electrode 651 may be removed, so that a slit 654S may be formed between the second molding layer 648 and the second spacer 653. A recessed bottom electrode 651R may remain below the slit 654S. The slit 654S may be self-aligned with the recessed bottom electrode 651R. The slit 654S may be formed to have a greater width than the bottom electrode 651R. In some embodiments, the slit 654S may be referred to as an opening or a contact hole.

Figure 53:
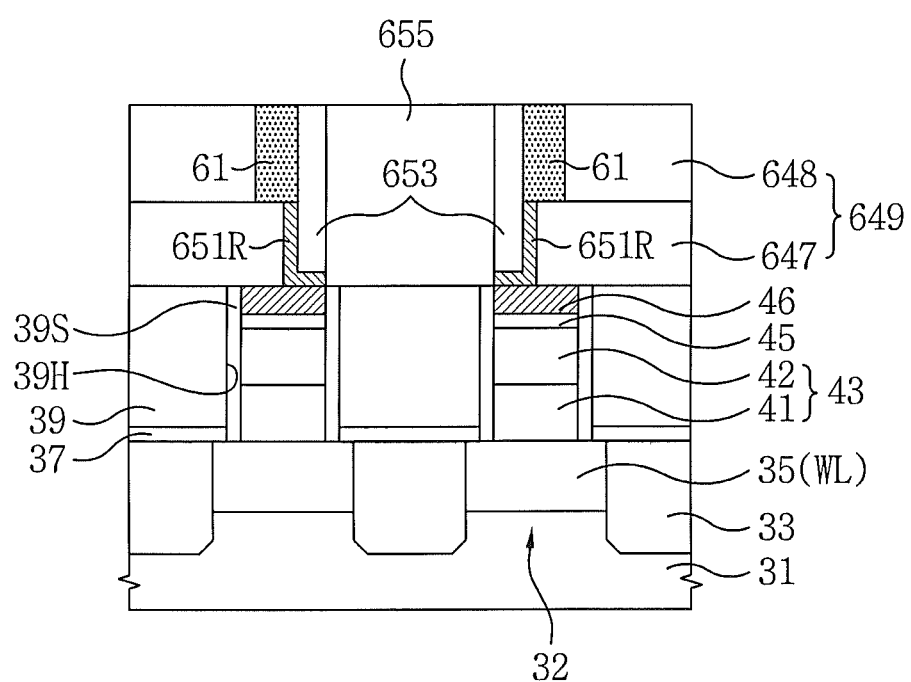

Referring to FIG. 53, a data storage plug 61 filling the slit 654S may be formed. A bottom of the data storage plug 61 may be in contact with the first molding layer 647 and the recessed bottom electrode 651R.

Figure 54A:
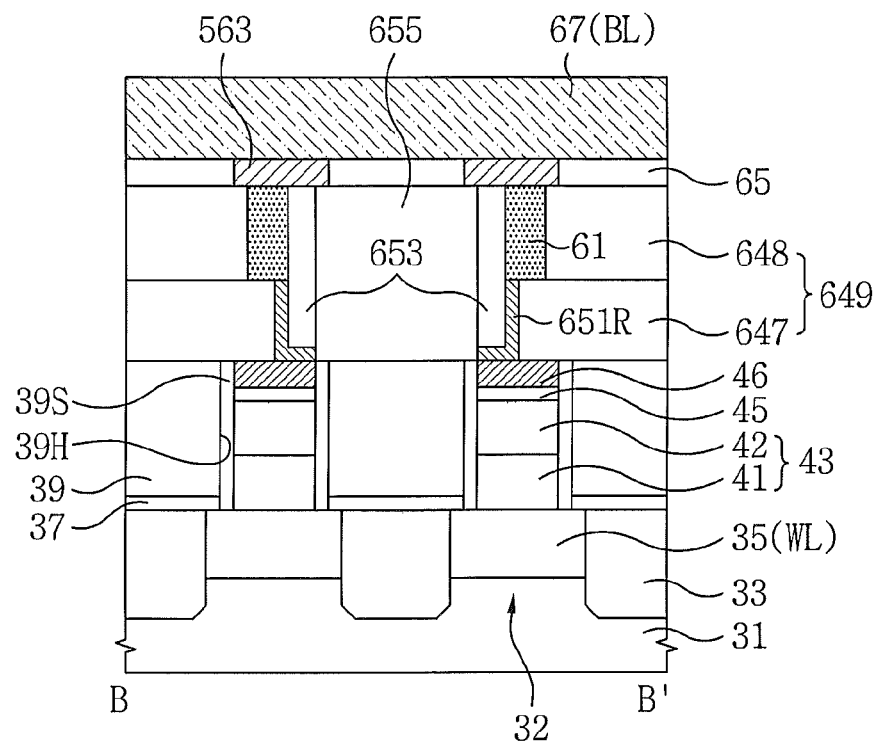

Referring to FIG. 54A, an upper electrode 563, an upper insulating layer 65, and a BL 67 may be formed on the data storage plug 61.

Figure 54B:
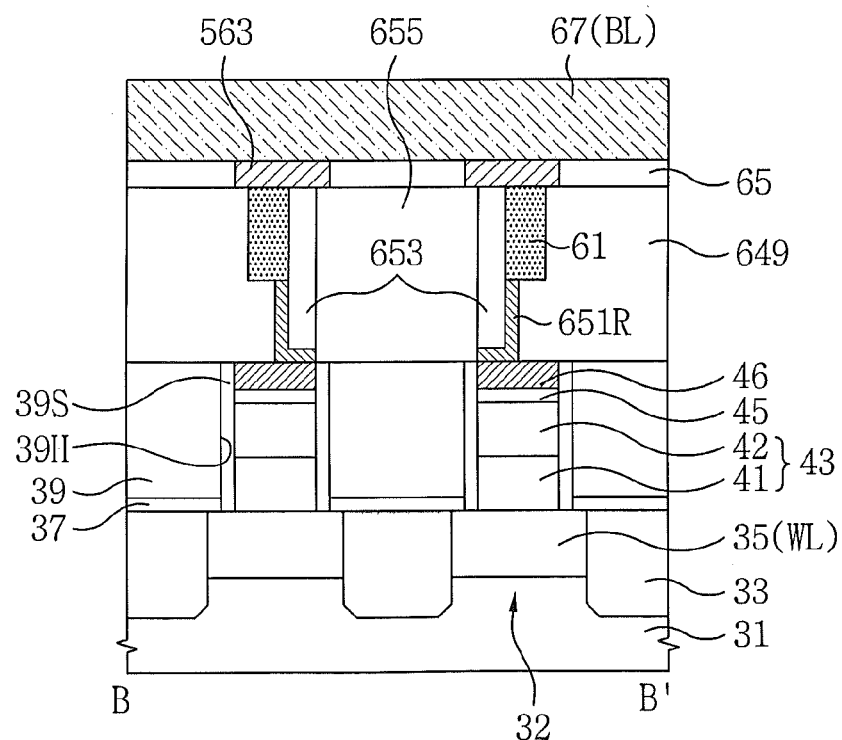

Referring to FIG. 54B, when the first insulating pattern 649 is formed of a single layer, the recessed bottom electrode 651R and the data storage plug 61 may be formed. The bottom of the data storage plug 61 may be in contact with the first insulating pattern 649 and the recessed bottom electrode 651R.

TENTH EMBODIMENT

Figure 55:
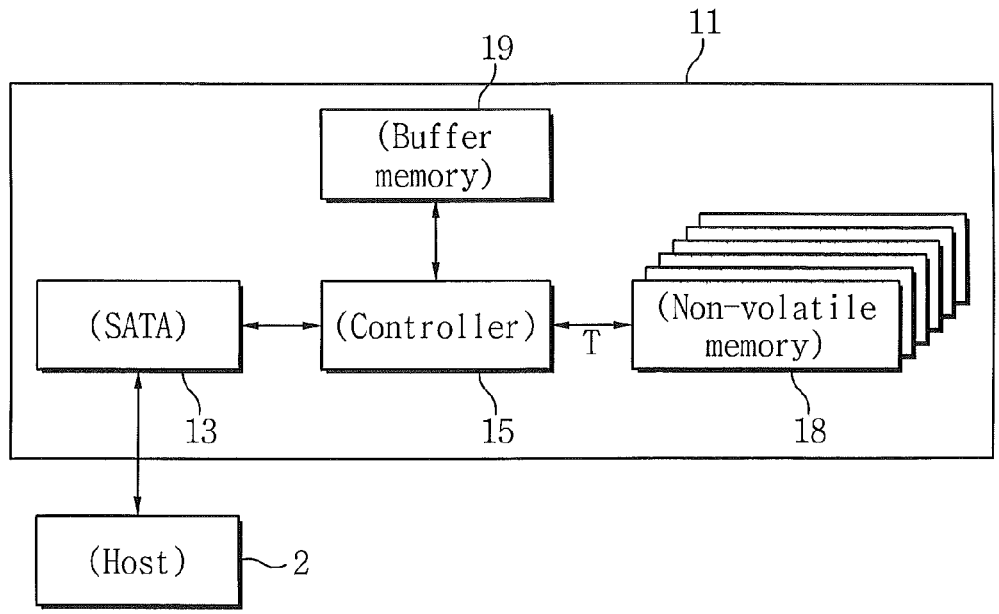
FIG. 55 is a system block diagram of an electronic system according to a tenth embodiment of the inventive concept.

FIG. 55 is a schematic block diagram of an electronic system according to a tenth embodiment. The electronic system may be a data storage device, such as a solid state disk (SSD) 11.

Referring to FIG. 55, the SSD 11 may include an interface 13, a controller 15, a non-volatile memory 18, and a buffer memory 19. The non-volatile memory 18 may include a semiconductor device similar to that described with reference to FIGS. 1 to 54B. For example, the non-volatile memory 18 may include the data storage plug 61 of FIG. 1, the bottom electrode structure 54R of FIG. 1, and the diode 43 of FIG. 1. In this case, the data storage plug may be self-aligned with the bottom electrode structure 54R of FIG. 1.

The SSD 11 is a device that stores information using a semiconductor device. The SSD 11 may be superior to a hard disk drive (HDD) in terms of speed, mechanical delay, error rate, generation of heat, noise, and compact size, and light weight. The SSD 11 may be used for a notebook PC, a desk top PC, an MP3 player or a portable storage device.

The controller 15 may be formed to be adjacent to the interface 13 and to be electrically connected thereto. The controller 15 may include a memory controller and a buffer controller. The non-volatile memory 18 may be formed to be adjacent to the controller 15 and to be electrically connected thereto. A data storage capacity of the SSD 11 may correspond to the non-volatile memory 18. The buffer memory 19 may be formed to be adjacent to the controller 15 and to be electrically connected thereto.

The interface 13 may be connected to a host 2 and may function to transmit and receive electrical signals such as data. For example, the interface 13 may be a device that uses a standard such as SATA, IDE, SCSI, and/or a combination thereof. The non-volatile memory 18 may be connected to the interface 13 via the controller 15. The non-volatile memory 18 may function to store data received via the interface 13. The non-volatile memory 18 is characterized by maintaining data stored therein even when power supplied to the SSD 11 is completely cut off.

The buffer memory 19 may include a volatile memory. The volatile memory may be a dynamic random access memory (DRAM) and/or a static random access memory (SRAM). The buffer memory 19 exhibits a faster operating rate than the non-volatile memory 18.

A data processing rate of the interface 13 may be faster than the operating rate of the non-volatile memory 18. Here, the buffer memory 19 may function to preliminarily store data. The data received via the interface 13 may be preliminarily stored in the buffer memory 19 via the controller 15, and may keep pace with a data writing rate of the non-volatile memory 18 to be permanently stored in the non-volatile memory 18. Moreover, data frequently used among data stored in the non-volatile memory 18 may be read in advance to be preliminarily stored in the buffer memory 19. That is, the buffer memory 19 may function to increase an effective operating rate of the SSD 11 and to reduce an error rate.

ELEVENTH EMBODIMENT

Figure 56:
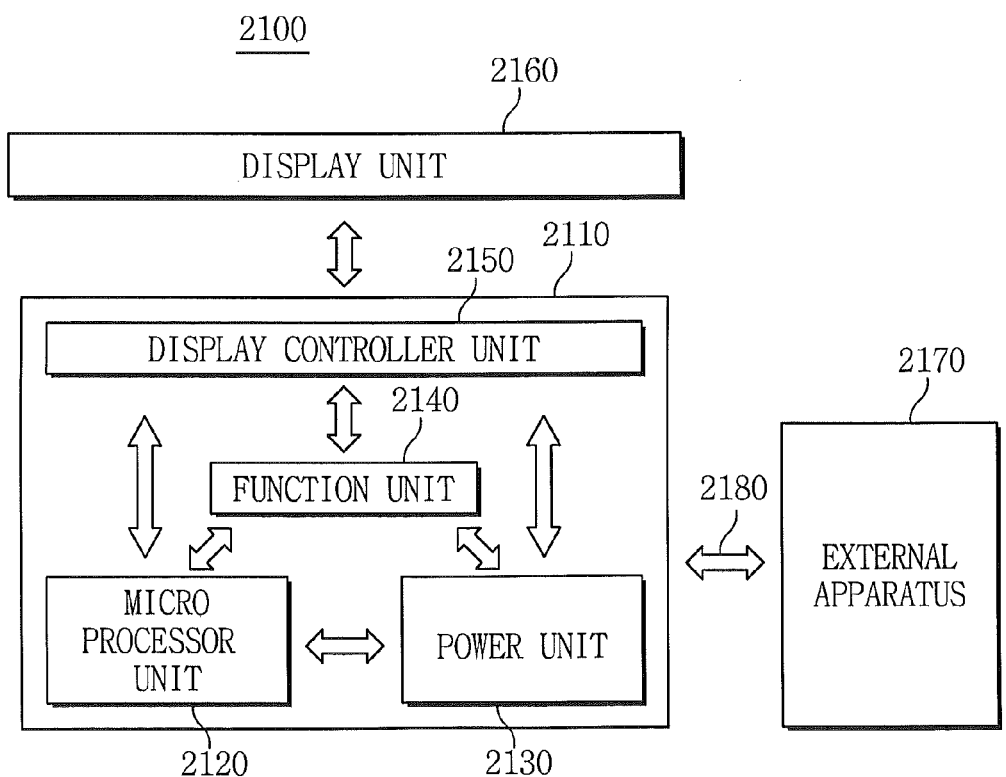
FIG. 56 is a system block diagram of an electronic system according to an eleventh embodiment of the inventive concept.

FIG. 56 is a system block diagram of an electronic system according to an eleventh embodiment.

Referring to FIG. 56, a semiconductor device similar to that described with reference to FIGS. 1 to 54B may be applied to an electronic system 2100. The electronic system 2100 may include a body 2110, a micro processor unit 2120, a power unit 2130, a functional unit 2140, and a display controller unit 2150. The body 2110 may be a mother board formed of a printed circuit board therein, and the micro processor unit 2120, the power unit 2130, the functional unit 2140 and the display controller unit 2150 may be mounted on the body 2110. A display unit 2160 may be disposed in or on a surface of the body 2110. The display unit 2160 may display an image processed by the display controller unit 2150 disposed on the surface of the body 2110.

The power unit 2130 is supplied with a predetermined voltage from an external battery (not shown), and divides the voltage into a required voltage level and supply the divided voltage to the micro processor unit 2120, the functional unit 2140 and the display controller unit 2150. The micro processor unit 2120 receives the voltage from the power unit 2130 to control the functional unit 2140, and the display unit 2160. The functional unit 2140 may perform various functions of the electronic system 2100. For example, when the electronic system 2100 is a cellular phone, the functional unit 2140 may include various components capable of performing functions of a cellular phone, such as dialing, outputting an image to the display unit 2160 through communication with an external apparatus 2170, and outputting voice through a speaker, and when a camera is mounted, the functional unit 2140 may be a camera image processor.

In some embodiments, when the electronic system 2100 is connected to a memory card for capacity expansion, the functional unit 2140 may be a memory card controller. The functional unit 2140 may transmit and receive a signal to/from the external apparatus 2170 through a wired or wireless communication unit 2180. For example, when the electronic system 2100 requires a universal serial bus (USB) for capacity expansion, the functional unit 2140 may be an interface controller.

A semiconductor device similar to that described with reference to FIGS. 1 to 54B may be applied to at least one of the micro processor unit 2120 and the functional unit 2140. For example, the micro processor unit 2120 or the functional unit 2140 may include the data storage plug 61 of FIG. 1, the bottom electrode structure 54R of FIG. 1, and the diode 43 of FIG. 1.

According to embodiments of the inventive concept, a data storage structure self-aligned with a bottom electrode structure can be provided. A plurality of bottom electrode structures and data storage plugs can be formed on a semiconductor substrate. A contact surface between the bottom electrode structure and the data storage plug can be generally uniform in shape on the entire surface of the semiconductor substrate. As a result, a memory device having excellent electrical properties can be implemented.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:
   forming a conductive pattern on a substrate;
   forming a first insulating pattern having a first trench on the conductive pattern;
   forming a first spacer on a sidewall of the first trench;
   forming a second trench exposing the conductive pattern below the first trench using the first spacer as an etch mask;
   forming a bottom electrode on sidewalls of the first spacer and the second trench;
   forming a second insulating pattern filling the first trench and the second trench;
   recessing the first spacer, recessing the bottom electrode, and forming an opening between the first insulating pattern and the second insulating pattern; and
   forming a data storage plug filling the opening.

2. The method of claim 1, wherein forming the first insulating pattern comprises:
   forming a first molding layer on the substrate having the conductive pattern;
   forming a second molding layer on the first molding layer;
   patterning the second molding layer; and
   forming the first trench.

3. The method of claim 2, wherein the first molding layer and the second molding layer are formed of different material layers, the first molding layer being exposed on a bottom of the first trench.

4. The method of claim 2, wherein the first spacer has a bottom in contact with the first molding layer.

5. A method of fabricating a semiconductor device, comprising:
   forming an insulating layer on a substrate having an opening therein;
   forming a bottom electrode and a spacer on opposing sidewalls of the insulating layer;
   forming a data storage plug having first and second sidewalls aligned with sidewalls of the bottom electrode and spacer, respectively.

6. The method of claim 5, wherein the bottom electrode has an L-shaped cross-section.

7. The method of claim 6, wherein a portion of the bottom electrode is disposed between the spacer and the substrate.

8. The method of claim 5, further comprising:
   forming a conductive pattern on the substrate, the insulating layer being formed on the conductive pattern such that the opening exposes the conductive pattern.

9. The method of claim 8, wherein the bottom electrode entirely covers a top surface of the conductive pattern.

* * * * *